(12) United States Patent
Platner et al.

(10) Patent No.: US 11,496,664 B2
(45) Date of Patent: Nov. 8, 2022

(54) ELECTRONIC DEVICES AND CORRESPONDING METHODS FOR MODIFYING VOICE COIL MOTOR DRIVE SIGNALS IN RESPONSE TO INFLUENCING MAGNECTIC FIELDS FROM DEVICE OPERATING CONDITIONS

(71) Applicant: Motorola Mobility LLC, Chicago, IL (US)

(72) Inventors: David Platner, Chicago, IL (US); Martin Pais, N. Barrington, IL (US)

(73) Assignee: Motorola Mobility LLC, Chicago, IL (US)

(*) Notice: Subject to any disclaimer, the term of this patent is extended or adjusted under 35 U.S.C. 154(b) by 62 days.

(21) Appl. No.: 16/953,252

(22) Filed: Nov. 19, 2020

(65) Prior Publication Data

US 2022/0159170 A1 May 19, 2022

(51) Int. Cl.
| | | |
|---|---|---|
| *H04N 5/232* | (2006.01) | |
| *G01R 33/00* | (2006.01) | |
| *G01R 33/07* | (2006.01) | |
| *G02B 7/08* | (2021.01) | |
| *H02K 41/035* | (2006.01) | |
| *H04N 5/225* | (2006.01) | |

(52) U.S. Cl.
CPC ..... *H04N 5/23212* (2013.01); *G01R 33/0023* (2013.01); *G01R 33/07* (2013.01); *G02B 7/08* (2013.01); *H02K 41/0358* (2013.01); *H04N 5/2253* (2013.01); *H04N 5/2254* (2013.01)

(58) Field of Classification Search
CPC ............. H04N 5/23212; H04N 5/2253; H04N 5/2254; G01R 33/0023; G01R 33/07; G02B 7/08; H02K 41/0358

USPC ........................................................ 348/350
See application file for complete search history.

(56) References Cited

U.S. PATENT DOCUMENTS

| | | |
|---|---|---|
| 8,995,241 B1 | 3/2015 | Heo et al. |
| 9,030,192 B2 | 5/2015 | Oliver et al. |

(Continued)

FOREIGN PATENT DOCUMENTS

| | | |
|---|---|---|
| JP | 2015088956 | 5/2015 |
| KR | 20120100673 | 9/2012 |

OTHER PUBLICATIONS

Schinneral, Arnold, "PCT Search Report", PCT/US2021/058948; Filed Nov. 11, 2021; dated Jan. 28, 2022.

(Continued)

*Primary Examiner* — Usman A Khan
(74) *Attorney, Agent, or Firm* — Philip H. Burrus, IV

(57) ABSTRACT

A method in an electronic device includes determining, with one or more processors, an operating condition of the electronic device influencing one or more magnetic fields measured by a voice coil motor sensor of the electronic device. The method includes obtaining, by the one or more processors from a memory of the electronic device, an expected voice coil motor sensor measurement that is a function of the operating condition. Thereafter, the method includes causing, by the one or more processors, a voice coil motor driver to modify a voice coil motor drive signal until the voice coil motor sensor detects the expected voice coil motor sensor measurement, thereby compensating for effects of the operating condition affecting the voice coil motor.

20 Claims, 12 Drawing Sheets

(56) References Cited

U.S. PATENT DOCUMENTS

| | | |
|---|---|---|
| 9,606,547 B2 | 3/2017 | Lee |
| 9,851,798 B2 | 12/2017 | Baer et al. |
| 9,860,447 B1 | 1/2018 | Beard et al. |
| 2003/0206505 A1* | 11/2003 | Hsu .................... G11B 7/0901 |
| 2009/0085558 A1 | 4/2009 | David et al. |
| 2011/0121666 A1* | 5/2011 | Park .................. H02K 41/0356 |
| | | 310/15 |
| 2013/0293179 A1 | 11/2013 | Lee |
| 2014/0265781 A1* | 9/2014 | Rader ...................... E05D 1/00 |
| | | 312/319.2 |
| 2018/0275369 A1* | 9/2018 | Takahashi ............ G02B 27/646 |
| 2019/0137728 A1 | 5/2019 | Wan et al. |
| 2019/0141248 A1 | 5/2019 | Hubert et al. |
| 2020/0142152 A1 | 5/2020 | Iguchi |

OTHER PUBLICATIONS

Eisenbeis, Ross , "Understanding & Applying Hall Effect Sensor Datasheets", Texas Instruments Application Report; Jul. 2014.

\* cited by examiner

| | FORCE X (mN) | FORCE Y (mN) | FORCE Z (mN) | HALL READING | CORRECTION F(X) |
|---|---|---|---|---|---|
| CONTROL | -5.1 | 6.9 | -20.8 | 1497 | N/A |
| HINGE OPEN | -5.6 | 6.8 | -21.5 | 1495 | +2 |
| HINGE CLOSED | -6.6 | 6.7 | -21.5 | 1488 | +9 |

…

ELECTRONIC DEVICES AND CORRESPONDING METHODS FOR MODIFYING VOICE COIL MOTOR DRIVE SIGNALS IN RESPONSE TO INFLUENCING MAGNECTIC FIELDS FROM DEVICE OPERATING CONDITIONS

BACKGROUND

Technical Field

This disclosure relates generally to electronic devices, and more particularly to electronic devices having voice coil motor components.

Background Art

Mobile electronic communication devices, such as mobile telephones, smart phones, gaming devices, and the like, have become ubiquitous. These devices are used for a variety of purposes, including voice and video telecommunications, sending and receiving text and multimedia messages, Internet browsing, electronic commerce, and social networking. Many are equipped with imagers that can be used to capture images, among other features. It would be advantageous to have improved methods and systems operable with these imagers and other features to improve the performance of the same.

Figure 1:
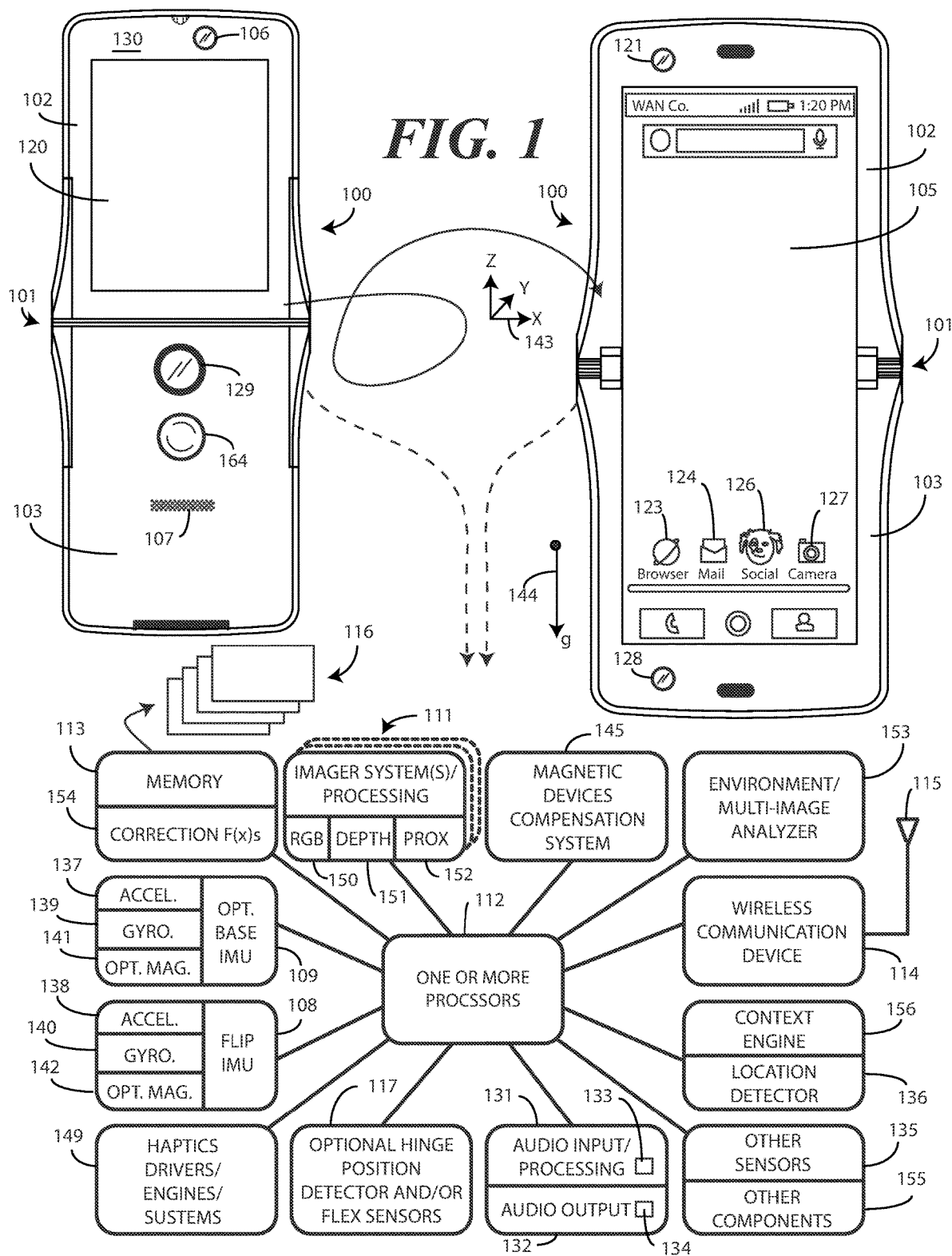
FIG. 1 illustrates one explanatory electronic device, along with an explanatory schematic block diagram, in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to modifying a voice coil motor drive signal until a voice coil motor sensor measures an expected voice coil motor sensor measurement to compensate for one or more magnetic fields measured by the voice coil motor sensor in response to an operating condition of an electronic device. Process descriptions or blocks in a flow chart can be modules, segments, or portions of code that implement specific logical functions of a machine or steps in a process, or alternatively that transition specific hardware components into different states or modes of operation. Alternate implementations are included, and it will be clear that functions may be executed out of order from that shown or discussed, including substantially concurrently or in reverse order, depending on the functionality involved.

It will be appreciated that embodiments of the disclosure described herein may be comprised of one or more conventional processors and unique stored program instructions that coil the one or more processors to implement, in conjunction with certain non-processor circuits, some, most, or all of the functions of causing a voice coil motor driver to modify a voice coil motor drive signal until a voice coil motor sensor obtains an expected voice coil motor sensor measurement that compensates for one or more magnetic fields measured by the voice coil motor sensor in response to a particular operating condition of the electronic device. The non-processor circuits may include, but are not limited to, imaging devices, flash devices, microphones, loudspeakers, acoustic amplifiers, digital to analog converters, signal drivers, clock circuits, power source circuits, and user input devices.

As such, these functions may be interpreted as steps of a method to perform operations such as using one or more processors to cause a voice coil motor driver to modify a voice coil motor drive signal to compensate for magnetic fields from an operating condition of the electronic device, or alternatively, steps of a method to calculate one or more voice coil motor correction factors, such as by measuring deviations to an optical center in response to those operating conditions, measuring deviations in voice coil motor sensor measurements, or combinations thereof.

Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ASICs with minimal experimentation.

Embodiments of the disclosure do not recite the implementation of any commonplace business method aimed at processing business information, nor do they apply a known business process to the particular technological environment of the Internet. Moreover, embodiments of the disclosure do not create or alter contractual relations using generic computer functions and conventional network operations. Quite to the contrary, embodiments of the disclosure employ methods that, when applied to electronic device having components employing voice coil motors, improve the functioning of the electronic device itself by facilitating more orientations and placements of objects manipulated by the voice coil motors. In one or more embodiments, this results in higher quality capture and presentation of images captured by an imager, which in turn improves the overall user experience to overcome problems specifically arising in the realm of the technology associated with image capture in electronic devices having hinged housings.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially", "essentially", "approximately", "about" or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide systems and methods for compensating voice coil motors when one or more magnetic fields occurring due to operations in an electronic device can be measured by a voice coil motor sensor of the electronic device. Illustrating by example, where an imager uses a voice coil motor to move a lens in three-dimensional space, embodiments of the disclosure contemplate that elements such as magnets situated within a device housing of the electronic device, electromagnetic components emitting magnetic fields when operating in certain conditions, and even ferrous metals such as iron and mu-metal can result in one or more magnetic fields being influenced as a function of operating conditions of the electronic device. Advantageously, embodiments of the disclosure compensate for this by causing a voice coil motor driver to modify a voice coil motor drive signal to compensate for this magnetic field influence.

In one or more embodiments, one or more processors of an electronic device determine an operating condition of the electronic device, where that operating condition influences one or more magnetic fields measured by the voice coil motor sensor of the electronic device. Upon determining the operating condition, in one or more embodiments the one or more processors obtain an expected voice coil motor sensor measurement that is a function of the operating condition. The one or more processors then cause a voice coil motor driver to modify a voice coil motor drive signal until the voice coil motor sensor detects the expected voice coil motor sensor measurement, thereby mitigating any effects caused by the particular operating condition.

In one or more embodiments, an electronic device includes a device housing. An imager is supported by the device housing, with the imager comprising a lens and an image sensor. In one or more embodiments, a voice coil motor positions the lens relative to the image sensor in three-dimensional space. Specifically, a voice coil motor driver delivers a voice coil motor drive signal to the voice coil motor. A voice coil motor sensor then detects a drive state of the voice coil motor by detecting magnetic fields associated with the voice coil motor drive signal. Accordingly, by measuring the magnetic fields associated with the voice coil motor drive signal, in one or more embodiments the voice coil motor sensor can determine the position of the lens, thereby providing a feed back loop that allows the voice coil motor to focus light upon the image sensor.

In one or more embodiments, one or more processors are operable with the voice coil motor driver. A memory is also operable with the one or more processors, and stores a plurality of expected voice coil motor sensor measurements that correspond to various operating conditions of the electronic device.

In one or more embodiments, the one or more processors determine an operating condition of the electronic device influencing one or more magnetic fields measured by the voice coil motor sensor. Thereafter, the one or more processors retrieve an expected voice coil motor sensor measurement from the memory that is a function of the operating condition of the electronic device. In one or more embodiments, the one or more processors then cause the voice coil motor driver to modify the voice coil motor drive signal until the voice coil motor sensor obtains the expected voice coil motor sensor measurement. This compensates for the magnetic field influence resulting from the operating condition of the electronic device, thereby moving the lens of the imager to the place it should be—and would be—had the operating condition of the electronic device not affected the operation of the voice coil motor.

The expected voice coil motor sensor measurements can be determined in a variety of ways, including detecting deviations in optical center resulting from a particular operating condition of the electronic device, detecting deviations in measurements of the voice coil motor sensor occurring during particular operating conditions of the electronic device, or combinations thereof. Illustrating by example, in one or more embodiments an optical center of an image sensor is determined when the electronic device is in a first operating condition. Thereafter, operation of the electronic device can be transitioned to a second operating condition influencing one or more magnetic fields measured by a voice coil motor sensor of the electronic device that cause a deviation in the optical center determined when the electronic device was operating in the first operating condition.

Using this deviation, the one or more processors can calculate a voice coil motor correction factor required to eliminate the deviation in the optical center while this second operating condition is occurring. This voice coil motor correction factor can then be stored in a table in memory for the second operating condition. When the one or more processors detect the second operating condition occurring in the field, they may employ the voice coil motor correction factor to cause the voice coil motor driver to modify the voice coil motor drive signal to compensate for deviations caused by this operating condition.

In other embodiments, a voice coil motor sensor can obtain a first voice coil motor sensor measurement when the electronic device is in the first operating condition. The voice coil motor sensor can then obtain a second voice coil motor sensor measurement when the electronic device is in the second operating condition. The difference in these two voice coil motor sensor measurements can then be used as another voice coil motor correction factor that can be stored in memory.

Of course, a combination of the two techniques can be used as well. For instance, the voice coil motor correction factor calculated from the translation of the optical center can be combined with the voice coil motor correction factor calculated from the difference in voice coil motor sensor measurements to create a combined voice coil motor correction factor for each operating condition the electronic device may encounter. Moreover, in one or more embodiments when the optical center deviation is identified, a modified drive signal can be applied to the coil of the voice coil motor to cause the optical center to return to true center while the second operating condition is occurring. This advantageously allows for an "interfered" voice coil motor sensor measurement to be used as a trusted, and accurate, measurement reading whenever the electronic device is operating in the second operating condition. Other advantages offered by embodiments of the disclosure will be described below. Still others will be obvious to those of ordinary skill in the art having the benefit of this disclosure.

Turning now to FIG. 1, illustrated therein is one explanatory electronic device 100 configured in accordance with one or more embodiments of the disclosure. The electronic device 100 of FIG. 1 is a portable electronic device. For illustrative purposes, the electronic device 100 is shown as a smartphone. However, the electronic device 100 could be any number of other portable electronic devices as well, including tablet computers, gaming devices, and so forth. Still other types of electronic devices can be configured in accordance with one or more embodiments of the disclosure as will be readily appreciated by those of ordinary skill in the art having the benefit of this disclosure.

The electronic device 100 includes a first device housing 102 and a second device housing 103. In one or more embodiments, a hinge 101 couples the first device housing 102 to the second device housing 103. In one or more embodiments, the first device housing 102 is selectively pivotable about the hinge 101 relative to the second device housing 103. For example, in one or more embodiments the first device housing 102 is selectively pivotable about the hinge 101 between a closed position, shown and described below with reference to FIG. 2, a partially open position, shown and described below with reference to FIG. 3, and an open position, shown and described below with reference to FIGS. 4-5.

In one or more embodiments the first device housing 102 and the second device housing 103 are manufactured from a rigid material such as a rigid thermoplastic, metal, or composite material, although other materials can be used. Still other constructs will be obvious to those of ordinary skill in the art having the benefit of this disclosure. In the illustrative embodiment of FIG. 1, the electronic device 100 includes a single hinge 101. However, in other embodiments two or more hinges can be incorporated into the electronic device 100 to allow it to be folded in multiple locations.

While the illustrative electronic device 100 of FIG. 1 includes a hinge 101, embodiments of the disclosure are not so limited. The electronic device can take numerous other forms as well, and can include other mechanical couplings between the first device housing 102 and the second device housing 103, or may include just a single device housing, known as a "candy bar," with no bendable, movable or slidable components whatsoever. Illustrating by example, in other embodiments, the electronic device 100 will be bendable, but will not include a hinge 101, such as when the first device housing 102 and the second device housing 103 are manufactured from bendable materials. In other embodiments, such as in candy bar implementations, the electronic device 100 will not be bendable. In still other embodiments, the electronic device 100 can be bendable via a combination of hinge components and non-hinge components. In yet other embodiments, a slider mechanism will couple the first device housing 102 to the second device housing 103. In still other embodiments, a rotator will couple the first device housing 102 to the second device housing 103. Still other physical embodiments and constructs of electronic devices will be obvious to those of ordinary skill in the art having the benefit of this disclosure.

Illustrating by example, in another embodiment the electronic device 100 of FIG. 1 includes a single housing, which is flexible. In one embodiment, the housing may be manufactured from a malleable, bendable, or physically deformable material such as a flexible thermoplastic, flexible composite material, flexible fiber material, flexible metal, organic or inorganic textile or polymer material, or other materials. The housing could be formed from a single flexible housing member or from multiple flexible housing members.

In other embodiments, the housing could be a composite of multiple components. For instance, in another embodiment the housing could be a combination of rigid segments connected by hinges or flexible materials. Still other constructs will be obvious to those of ordinary skill in the art having the benefit of this disclosure.

The illustrative electronic device 100 of FIG. 1 includes multiple displays. A first display 105, also referred to as the interior display or the rear-facing display, is concealed when the first device housing 102 is pivoted about the hinge 101 relative to the second device housing 103 to a closed position. For example, the first display 105 is concealed in FIG. 2 below. This first display 105 is then revealed when the first device housing 102 is pivoted about the hinge 101 relative to the second device housing 103 from the closed position to an axially displaced open position. Thus, the first display 105 is revealed as the electronic device 100 transitions from the closed position of FIG. 2 to the open position of FIGS. 4-5.

In one or more embodiments, the electronic device 100 also includes at least a second display 120. In the illustrative embodiment of FIG. 1, the second display 120 can be referred to as an exterior display or front-facing display, as the second display 120 is exposed both when the first device housing 102 and the second device housing 103 are pivoted about the hinge 101 to the closed position or the axially displaced open position. Thus, the second display 120 is exposed both in the axially displaced open position of FIG. 1 and the closed position of FIG. 2. In one or more embodiments, each of the first display 105 and the second display 120 is a high-resolution display.

While shown coupled to the first device housing 102, it should be noted that the second display 120 could be coupled to either of the first device housing 102 or the second device housing 103. In other embodiments, the second display 120 can be coupled to the first device housing 102, while a third display (not shown) is coupled to the second device housing 103. Thus, electronic devices configured in accordance with embodiments of the disclosure can include displays situated at different positions.

As with the second display 120, the first display 105 can also be coupled to either or both of the first device housing 102 or the second device housing 103. In this illustrative embodiment, the first display 105 is coupled to both the first device housing 102 and the second device housing 103 and spans the hinge 101. In other embodiments, as will be described below with reference to FIG. 6, the "first" display can be two displays, with one coupled to the first device housing 102 and another coupled to the second device housing 103. In either case, this first display 105 is considered to be an "interior" display because it is concealed when the first device housing 102 and the second device housing 103 are in the closed position.

In one or more embodiments, either or both of first display 105 or second display 120 can be touch-sensitive. Where this is the case, users can deliver user input to one or both of the first display 105 or the second display 120 by delivering touch input from a finger, stylus, or other objects disposed proximately with the first display 105 or the second display 120.

In the illustrative embodiment of FIG. 1, since the first display 105 spans the hinge 101, it is configured to be flexible. For instance, in one embodiment the first display 105 is configured as an organic light emitting diode (OLED) display fabricated on a flexible plastic substrate. This allows the first display 105 to be flexible so as to deform when the first device housing 102 pivots about the hinge 101 relative to the second device housing 103. However, it should be noted that other types of displays would be obvious to those of ordinary skill in the art having the benefit of this disclosure. As will be described below with reference to FIG. 6, in other embodiments conventional, rigid displays can be disposed to either side of the hinge rather than using a flexible display.

In one or more embodiments, the first display 105 is configured as an OLED constructed on flexible plastic substrates to allow the first display 105 to bend in accordance with various bending radii. For example, some embodiments allow bending radii of between thirty and six hundred millimeters to provide a bendable display. Other substrates allow bending radii of around five millimeters to provide a display that is foldable through active bending. Other displays can be configured to accommodate both bends and folds. In one or more embodiments the first display 105 may be formed from multiple layers of flexible material such as flexible sheets of polymer or other materials.

In this illustrative embodiment, the first display 105 is coupled to the first device housing 102 and the second device housing 103. Accordingly, the first display 105 spans the hinge 101 in this embodiment. In one or more embodiments, the first display 105 can instead optionally be coupled to one, or two, spring-loaded, slidable trays that situate within one or both of the first device housing 102 and the second device housing 103. The use of one or two slidable trays allows the first display 105 to be placed in tension when the electronic device 100 is in the open position. This causes the first display 105 to be flat, rather than wavy due to mechanical memory effects, when the electronic device 100 is in the open position.

Features can be incorporated into the first device housing 102 and/or the second device housing 103. Examples of such features include imager 106, which in this embodiment is an exterior or front facing imager situated along the exterior 130 of the first device housing 102. The imager 106, which can be any number of types of image capture devices, has its lens situated such that it is directed away from a user who is holding the electronic device 100 and facing the first display 105 when the first device housing 102 has been pivoted about the hinge 101 relative to the second device housing 103 to the axially displaced open position shown in FIG. 1. As will be described in more detail below with reference to FIG. 9, in one or more embodiments the imager 106 includes a voice coil motor operable to move an interior lens relative to an image sensor to focus light upon the image sensor. This allows the image sensor of the imager 106 to receive focused light directed toward the electronic device 100 from a location in front of the user when the user is holding the electronic device 100 and facing the first display 105, which becomes exposed in the axially displaced open position of FIG. 1.

Instead of, or alternatively in addition to, the imager 106, a second, rear facing imager 121 can be positioned on the interior side of the electronic device 100 to receive light and images directed toward the first display 105. The second, rear facing imager 121 can be situated in the first device housing 102 or the second device housing 103. When a user is holding the electronic device 100 and looking at the first display, this second, rear facing imager 121 can be used to take a selfie without turning the electronic device 100 around.

While two imagers are shown in the illustrative embodiment of FIG. 1, it should be noted that embodiments of the disclosure can include additional imagers mounted in different positions that can be actuated to capture images from different angles. For example, in one or more embodiments the electronic device 100 can include a third imager 128 located on the second device housing 103 that is also positioned on the interior side of the electronic device 100 to receive light and images directed toward the first display 105. Likewise, the electronic device 100 can include a fourth imager 129 that is situated along the exterior side of the second device housing 103 such that it is directed away from a user who is holding the electronic device 100 and facing the first display 105 when the electronic device 100 is in the axially displaced open position of FIG. 1. Additional imagers can be added as necessary.

Moreover, the locations of the imagers can vary as well. Illustrating by example, if the electronic device includes only two imagers, e.g., first imager 106 and second imager 121, they could be repositioned. For instance, second imager 121 could be relocated to the position occupied by the third imager 128 in FIG. 1, or to another location. Similarly, first imager 106 could be relocated to the position occupied by the fourth imager 129, or to another location.

In one or more embodiments, the electronic device 100 includes at least one externally facing imager situated in the first device housing 102. Thus, in one or more embodiments, the electronic device 100 includes either multiple external imagers, e.g., the imager 106 and the imager 129, with at least one of those imagers situated in the first device housing 102 like imager 106 (albeit possibly at a different location on the exterior of the first device housing 102), or a single external imager, e.g., first imager 106, but situated in the first device housing 102, situated as shown or at another location along the exterior 130 of the first device housing 102. Having two externally facing imagers, e.g., imager 106 situated on the exterior 130 of the first device housing 102 and imager 129 situated on the exterior of the second device housing 103 advantageously allows both front facing and rear facing images to be captured when the first device housing 102 pivots about the hinge 101 relative to the second device housing 103 to the closed position of FIG. 2. However, in other embodiments, only imager 106 will be included on the exterior 130 of the first device housing 102 to simplify the hardware.

Similarly, in one or more embodiments the electronic device 100 includes at least one internally facing imager such as imager 121. While the interior of the first device housing 102 and the second device housing 103 can each include imagers, e.g., imager 121 and imager 128, since they face the same direction and are only exposed when the first device housing 102 pivots about the hinge 101 relative to the second device housing 103 to the axially displaced open position of FIG. 1, in many applications only a single imager, situated along the interior of either the first device housing 102 or the second device housing 103 will be included. Other configurations with other numbers and placements of imager will be obvious to those of ordinary skill in the art having the benefit of this disclosure.

Other examples of features that can be incorporated into the first device housing 102 and/or the second device housing 103 include an optional speaker port 107. While shown situated on the exterior of the electronic device 100 in FIG. 1, the optional speaker port 107 could also be placed on the interior side as well. In this illustrative embodiment, a user interface component, configured as a button 164, which may be a button or touch sensitive surface, can also be disposed along the exterior side of the second device housing 103. As noted, any of these features shown being disposed on the exterior side of the electronic device 100 could be located elsewhere, such as on the interior side or minor sides in other embodiments.

A block diagram schematic of the electronic device 100 is also shown in FIG. 1. In one or more embodiments, the block diagram schematic is configured as a printed circuit board assembly disposed within the first device housing 102, the second device housing 103, or in both the first device housing 102 and the second device housing 103. Various components can be electrically coupled together by conductors or a bus disposed along one or more printed circuit boards. It should be noted that the block diagram schematic includes many components that are optional, but which are included in an effort to demonstrate how varied electronic devices configured in accordance with embodiments of the disclosure can be.

Thus, it is to be understood that the block diagram schematic of FIG. 1 is provided for illustrative purposes only and for illustrating components of one electronic device 100 in accordance with embodiments of the disclosure. The block diagram schematic of FIG. 1 is not intended to be a complete schematic diagram of the various components required for an electronic device 100. Therefore, other electronic devices in accordance with embodiments of the disclosure may include various other components not shown in FIG. 1, or may include a combination of two or more components or a division of a particular component into two or more separate components, and still be within the scope of the present disclosure.

In one embodiment, the electronic device 100 includes one or more processors 112. In one embodiment, the one or more processors 112 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the electronic device 100. Each of the application processor and the auxiliary processor(s) can be configured to process and execute executable software code to perform the various functions of the electronic device 100. In one or more embodiments, each of the application processor and the auxiliary processor(s) is operable with the other components, modules, applications, and engines of the electronic device 100. A storage device, such as memory 113, can optionally store the executable software code used by the one or more processors 112 during operation.

In one or more embodiments, the electronic device 100 also includes one or more image capture application modules 111. In one or more embodiments, each imager, e.g., imager 106 and imager 121, include a separate image capture application module, which is why additional image capture application modules are shown in dashed line in FIG. 1. In other embodiments, the electronic device 100 will include a single image capture application module that is operable with multiple imagers.

In one or more embodiments, the image capture application module(s) 111 identify actuation of one or more imagers. For example, where the electronic device 100 includes one image capture application module 111 operable with two imagers, the image capture application module 111 can identify actuation of imager 106 and/or second imager 121 and/or image capture operations. For example, the image capture application module 111 can detect user actuation of the imager 106 and/or second imager 121.

The image capture application module 111 can also include a facial recognition module that analyzes images captured by the imager 106 and/or second imager 121 to identify facial characteristics present in images captured by the imager 106 and/or second imager 121. In one or more embodiments, in response to the image capture application module 111 identifying these or other image capture operations, the one or more processors can cause the presentation of image capture assistance content as will be described in more detail below.

In one or more embodiments, each imager operable with the imager capture application module 111, e.g., imager 106 and/or imager 121, can be simply a conventional imager. For example, these imagers can comprise a two-dimensional imager 150 configured to receive at least one image of objects within an environment of the electronic device 100. In one embodiment, these imagers comprise a two-dimensional Red-Green-Blue (RGB) imager. In another embodiment, these imagers comprise a two-dimensional infrared imager. Other types of imagers suitable for use as imager 106, imager 121, or other imagers of the electronic device 100 will be obvious to those of ordinary skill in the art having the benefit of this disclosure.

In other embodiments, these imagers can be more complex. Illustrating by example, in another embodiment one or more of imager 106, imager 121, or the other imagers of the electronic device 100 also include a depth imager 151. Where included, the depth imager 151 can take a variety of forms. In a first embodiment, the depth imager 151 comprises a pair of imagers separated by a predetermined distance, such as three to four images. This "stereo" imager works in the same way the human eyes do in that it captures images from two different angles and reconciles the two to determine distance.

In another embodiment, the depth imager 151 employs a structured light laser. The structured light laser projects tiny light patterns that expand with distance. These patterns land on a surface, such as a user's face, and are then captured by an imager. By determining the location and spacing between the elements of the pattern, three-dimensional mapping can be obtained.

In still another embodiment, the depth imager 151 comprises a time of flight device. Time of flight three-dimensional sensors emit laser or infrared pulses from a photodiode array. These pulses reflect back from a surface, such as the user's face. The time it takes for pulses to move from the photodiode array to the surface and back determines distance, from which a three-dimensional mapping of a surface can be obtained. Regardless of embodiment, where included the depth imager 151 adds a third "z-dimension" to the x-dimension and y-dimension defining the two-dimensional image captured by the two-dimensional imager 150, thereby enhancing the image capture features of the electronic device 100.

The imagers can also be operable with one or more proximity sensors 152. As with the depth imager 151, where included, the one or more proximity sensors 152 can take various forms. In one or more embodiments, the one or more proximity sensors 152 fall in to one of two camps: active proximity sensors and "passive" proximity sensors. Either the proximity detector components or the proximity sensor components can be generally used for distance determination, changes in distance between a source, e.g., a user of the electronic device, and the electronic device 100 and another object. As used herein, a "proximity sensor component" comprises a signal receiver only that does not include a corresponding transmitter to emit signals for reflection off an object to the signal receiver. By contrast, proximity detector components include a signal emitter and a corresponding signal receiver, which constitute an "active IR" pair.

In one embodiment, the one or more proximity sensors 152 simply comprise a proximity sensor component. In another embodiment, the one or more proximity sensors 152 comprise a simple thermopile. In another embodiment, the one or more proximity sensors 152 comprise an infrared imager that captures the amount of thermal energy emitted by an object. In still other embodiments, the one or more proximity sensors 152 comprise a proximity detector component. Of course, combinations of these components can be used as the one or more proximity sensors 152. Moreover, other types of proximity sensors suitable for use with the electronic device 100 will be obvious to those of ordinary skill in the art having the benefit of this disclosure.

In one or more embodiments, the image capture application module(s) 111 can be operable with an environmental analyzer 153. The environmental analyzer 153 can be configured to process an image or depth scan of an object and determine whether the object matches predetermined criteria by comparing the image or depth scan to one or more predefined authentication references stored in memory 113.

In this illustrative embodiment, the electronic device 100 also includes a communication circuit 114 that can be configured for wired or wireless communication with one or more other devices or networks. The networks can include a wide area network, a local area network, and/or personal area network. The communication circuit 114 may also utilize wireless technology for communication, such as, but are not limited to, peer-to-peer or ad hoc communications such as HomeRF, Bluetooth and IEEE 802.11, and other forms of wireless communication such as infrared technology. The communication circuit 114 can include wireless communication circuitry, one of a receiver, a transmitter, or transceiver, and one or more antennas 115.

In one embodiment, the one or more processors 112 can be responsible for performing the primary functions of the electronic device 100. For example, in one embodiment the one or more processors 112 comprise one or more circuits operable with one or more user interface devices, which can include the display 105, to present, images, video, or other presentation information to a user. The executable software code used by the one or more processors 112 can be configured as one or more modules 116 that are operable with the one or more processors 112. Such modules 116 can store instructions, control algorithms, logic steps, and so forth.

In one embodiment, the one or more processors 112 are responsible for running the operating system environment of the electronic device 100. The operating system environment can include a kernel and one or more drivers, and an application service layer, and an application layer. The operating system environment can be configured as executable code operating on one or more processors or control circuits of the electronic device 100.

The application layer can be responsible for executing application service modules. The application service modules may support one or more applications or "apps." These applications can optionally be applications that use orientation data of the first device housing 102, the second device housing 103, and/or the electronic device 100 as input. Such orientation-based applications can be stored in the memory 113 of the electronic device 100 in one or more embodiments.

Examples of applications shown in FIG. 1 include an a navigation application 123, which may include an augmented reality application to superimpose identifiers on objects, such as buildings, landmarks, streets, houses, or other objects captured in images by the imager 106 or second imager 121. Other applications include an electronic mail application 124, a social media application 126, and an image capture application 127 that launches the imager 106, the second imager 121, and/or any other imagers included with the electronic device 100.

These applications are illustrative only, as numerous others will be obvious to those of ordinary skill in the art having the benefit of this disclosure. The applications of the application layer can be configured as clients of the application service layer to communicate with services through application program interfaces (APIs), messages, events, or other inter-process communication interfaces. Where auxiliary processors are used, they can be used to execute input/output functions, actuate user feedback devices, and so forth.

In one embodiment, the electronic device 100 optionally includes one or more hinge alignment sensors 117 configured to detect an angular alignment between the first device housing 102 and the second device housing 103 about the hinge 101, i.e., where the hinge 101 serves as the pivot fulcrum for the first device housing 102 and the second device housing 103. The one or more hinge alignment sensors 117 can include one or more flex sensors that are operable with the one or more processors 112 to detect a bending operation that causes the first device housing 102 to pivot about the hinge 101 relative to the second device housing 103, thereby transforming the electronic device 100 into a deformed geometry, such as that shown in FIGS. 2-3. The inclusion of the one or more hinge alignment sensors 117, be they flex sensors or another type of sensor, is optional. In some embodiment the one or more hinge alignment sensors 117 will not be included.

Where configured as flex sensors, the one or more hinge alignment sensors 117 can be configured as passive resistive devices manufactured from a material with an impedance that changes when the material is bent, deformed, or flexed. By detecting changes in the impedance as a function of resistance, the one or more processors 112 can use the flex sensors to detect bending of the first device housing 102 about the hinge 101 relative to the second device housing 103. In one or more embodiments, each flex sensor comprises a bi-directional flex sensor that can detect flexing or bending in two directions. In one embodiment, the one or more flex sensors have an impedance that increases in an amount that is proportional with the amount it is deformed or bent. Other types of sensors suitable for use as hinge alignment sensors will be obvious to those of ordinary skill in the art having the benefit of this disclosure.

In other embodiments, the one or more hinge alignment sensors 117 detect angles between the first device housing 102 and the second device housing 103 in other ways. For example, the one or more hinge alignment sensors 117 can detect the first device housing 102 pivoting about the hinge 101 relative to the second device housing 103 from the axially displaced open position to the closed position by detecting the inner surfaces of the first device housing 102 and the second device housing 103 abutting. For instance, a magnet can be placed in the first device housing 102, while a magnetic sensor is placed in the second device housing 103, or vice versa. The magnetic sensor could be Hall-effect sensor, a giant magnetoresistance effect sensor, a tunnel magnetoresistance effect sensor, an anisotropic magnetoresistive sensor, or other type of sensor.

In still other embodiments, the one or more hinge alignment sensors 117 can comprise an inductive coil placed in the first device housing 102 and a piece of metal placed in the second device housing 103, or vice versa. When the metal is in close proximity to the coil, the one or more hinge alignment sensors 117 detect the first device housing 102 and the second device housing 103 in a first position. By contrast, when the metal is farther away from the coil, the one or more hinge alignment sensors 117 can detect the first device housing 102 and the second device housing 103 being in a second position, and so forth. Other examples of sensors suitable for use as the one or more hinge alignment sensors 117 will be obvious to those of ordinary skill in the art having the benefit of this disclosure.

In other embodiments the one or more hinge alignment sensors 117 can be omitted, as an optional inertial motion unit 108 can be situated in the first device housing 102, with an inertial motion unit 109 situated in the second device housing 103. These inertial motion units 108, 109 can be used to compare motion sensor readings to track the relative movement and/or position of the first device housing 102 relative to the second device housing 103, as well as the first device housing 102 and the second device housing 103 relative to the gravitational direction 144. This data can be used to determine and or track the state and position of the first device housing 102 and the second device housing 103 directly as they pivot about the hinge 101, as well as their orientation with reference to a gravitational direction 144 in three-dimensional space 143.

In one or more embodiments, the electronic device 100 includes an audio input/processor 131. The audio input/processor 131 can include hardware, executable code, and speech monitor executable code in one embodiment. The audio input/processor 131 can include, stored in memory 113, basic speech models, trained speech models, or other modules that are used by the audio input/processor 131 to receive and identify voice commands that are received with audio input captured by an audio input/processor 131, one example of which is a microphone 133. In one embodiment, the audio input/processor 131 can include a voice recognition engine. Regardless of the specific implementation utilized in the various embodiments, the audio input/processor 131 can access various speech models to identify speech commands in one or more embodiments.

In one embodiment, the audio input/processor 131 is configured to implement a voice control feature that allows the electronic device 100 to function as a voice assistant device, which may be configured as a voice assistant engine. In one or more embodiments, the voice assistant engine is a digital assistant using voice recognition, speech synthesis, and natural language processing to receive audio input comprising a voice command from a source, determine the appropriate response to the voice command, and then deliver the response in the form of audio output in response to receiving the audio input from the source. When so configured, a user can cause the emanation of the audio input from their mouth to cause the one or more processors 112 of the electronic device 100 to execute a control operation.

Various sensors 135 can be operable with the one or more processors 112. A first example of a sensor that can be included with the various sensors 135 is a touch sensor. The touch sensor can include a capacitive touch sensor, an infrared touch sensor, resistive touch sensors, or another touch-sensitive technology.

Another example of a sensor 135 is a geo-locator that serves as a location detector 136. In one embodiment, location detector 136 is able to determine location data of the electronic device 100. Location can be determined by capturing the location data from a constellation of one or more earth orbiting satellites, or from a network of terrestrial base stations to determine an approximate location. The location detector 136 may also be able to determine location by locating or triangulating terrestrial base stations of a traditional cellular network, such as a CDMA network or GSM network, or from other local area networks, such as Wi-Fi networks.

Embodiments of the disclosure contemplate that the electronic device 100 may include one or more features or applications that depend upon orientation determination signals received from an optional inertial motion unit 108, 109. Accordingly, in one or more embodiments the electronic device 100 includes at least one inertial motion unit 108, 109. In one embodiment, the electronic device 100 includes only a single inertial motion unit 108 that is situated in the first device housing 102. In another embodiment, the electronic device 100 optionally includes a second inertial motion unit 109 that is situated in the second device housing 103. Additional inertial motion units can be included as necessitated by a particular application.

In one or more embodiments, each inertial motion unit 108, 109 comprises a combination of one or more accelerometers 137, 138 and one or more gyroscopes 139, 140, and optionally one or more magnetometers 141, 142, to determine the orientation, angular velocity, and/or specific force of one or both of the first device housing 102 or the second device housing 103. When included in the electronic device 100, these inertial motion units 108, 109 can be used as orientation sensors to measure the orientation of one or both of the first device housing 102 or the second device housing 103 in three-dimensional space 143. Similarly, the inertial motion units 108, 109 can be used as orientation sensors to measure the motion of one or both of the first device housing 102 or second device housing 103 in three-dimensional space 143. The inertial motion units 108, 109 can be used to make other measurements as well.

In one or more embodiments, the inertial motion unit 108 situated in the first device housing 102, and, where included, the inertial motion unit 109 situated in the second device housing 103, can be configured as orientation detectors that determines the orientation and/or movement of one or both of the first device housing 102 or the second device housing 103 in three-dimensional space 143. Illustrating by example, each inertial motion unit 108, 109 can determine the spatial orientation of one or both of the first device housing 102 or the second device housing 103 in three-dimensional space 143 by, for example, detecting a gravitational direction 144 using an accelerometer 137, 138. In addition to, or instead of, an accelerometer 137, 138, magnetometers 141, 142 can be included to detect the spatial orientation of the electronic device relative to the earth's magnetic field. Similarly, one or more gyroscopes 139, 140 can be included to detect rotational orientation of the electronic device 100.

Motion of the electronic device 100 can similarly be detected. The accelerometers 137, 138, gyroscopes 139, 140, and/or magnetometers 141, 142 can be used as a motion detector in an electronic device 100. Using the accelerometers 137, 138 as an example, such devices can be included to detect motion of the electronic device 100. Additionally, the accelerometers 137, 138 can be used to sense some of the gestures of the user, such as one talking with their hands, running, or walking.

The inertial motion units 108, 109 can also be used to determine the spatial orientation of an electronic device 100 in three-dimensional space 143 by detecting a gravitational direction 144. Similarly, the gyroscopes 139, 140 can be included to detect rotational motion of the electronic device 100.

In one or more embodiments, each inertial motion unit 108, 109 determines an orientation of the device housing in which it is situated in three-dimensional space. For example, where only one inertial motion unit 108 is included in the first device housing 102, this inertial motion unit 108 is configured to determine an orientation, which can include measurements of azimuth, plumb, tilt, velocity, angular velocity, acceleration, and angular acceleration, of the first device housing 102. Similarly, where two inertial motion units are included, with one inertial motion unit 108 being situated in the first device housing 102 and another inertial motion unit 109 being situated in the second device housing 103, each inertial motion unit 108, 109 determines the orientation of its respective device housing. Inertial motion unit 108 can determine measurements of azimuth, plumb, tilt, velocity, angular velocity, acceleration, angular acceleration, and so forth of the first device housing 102, while inertial motion unit 108 can determine measurements of azimuth, plumb, tilt, velocity, angular velocity, acceleration, angular acceleration, and so forth of the second device housing 103.

Continuing with the description of the block diagram schematic of FIG. 1, still other sensors 135 can be included with the electronic device 100 as well. For instance, another example of a sensor 135 is a force sensor. Where included, the force sensor can take various forms. For example, in one embodiment, the force sensor comprises resistive switches or a force switch array configured to detect contact with either the display or the housing of an electronic device. The array of resistive switches can function as a force-sensing layer, in that when contact is made with either the surface of the display or the housing of the electronic device, changes in impedance of any of the switches may be detected. The array of switches may be any of resistance sensing switches, membrane switches, force-sensing switches such as piezoelectric switches, or other equivalent types of technology. In another embodiment, the force sensor can be capacitive. In yet another embodiment, piezoelectric sensors can be configured to sense force as well. For example, where coupled with the lens of the display, the piezoelectric sensors can be configured to detect an amount of displacement of the lens to determine force. The piezoelectric sensors can also be configured to determine force of contact against the housing of the electronic device 100 rather than the display 105, 120.

Other components 155 operable with the one or more processors 112 can include output components such as video, audio, and/or mechanical outputs. For example, the output components may include a video output component or auxiliary devices including a cathode ray tube, liquid crystal display, plasma display, incandescent light, fluorescent light, front or rear projection display, and light emitting diode indicator. Other examples of output components include audio output components 132 such as the one or more loudspeakers 134, the ultrasound transducers (where included), or other alarms and/or buzzers. The other components 155 can also include a mechanical output component such as vibrating or motion-based mechanisms.

The other components 155 can optionally include a barometer operable to sense changes in air pressure due to elevation changes or differing pressures of the electronic device 100. The other components 155 can also optionally include a light sensor that detects changes in optical intensity, color, light, or shadow in the environment of an electronic device 100. An infrared sensor can be configured to detect thermal emissions from an environment about the electronic device 100. Similarly, a temperature sensor can be configured to monitor temperature about the electronic device 100.

In one or more embodiments, the one or more processors 112 can define one or more process engines, one example of which is a magnetic devices compensation engine 145. As noted above, and as will be described in more detail below with reference to FIG. 9, in one or more embodiments one or more of the imagers 106,121 include a voice coil motor operable to move a lens in three-dimensional space 143 relative to an image sensor. This voice coil motor works when a voice coil motor driver delivers a voice coil motor drive signal to a coil to move the lens of the imager 106,121 in three-dimensional space 143. A voice coil motor sensor then measures a magnetic field emanated by the coil of the voice coil motor to determine where the lens is in the three-dimensional space 143. By adjusting the voice coil motor drive signal such that the voice coil motor sensor receives the appropriate voice coil motor measurement, a feedback loop is created allowing the lens of the imager 106,121 to be precisely moved to a desired position that focuses received light upon the imager's image sensor so that photographs, video, and other media can be captured.

Embodiments of the disclosure contemplate that many components of the electronic device 100, e.g., accelerometers 137,138, gyroscopes 139,140, haptic components 149 and other electromotive components, loudspeakers 134, and even the communication circuit 114 can generate—or absorb—magnetic fields that influence the magnetic fields measured by the voice coil motor sensor of the imagers 106,121. Embodiments of the disclosure also contemplate that the one or more processors 112 may generate commands or execute control operations based on information received from the various sensors 135, including the inertial motion unit(s) 108,109, the one or more hinge alignment sensors 117 (where included), or the other sensors 135, thereby determining an operating condition of the electronic device 100. The one or more processors 112 can, for example, tell whether the first device housing 102 and the second device housing 103 are pivoted about the hinge 101 to the axially displaced open position or to the closed position, what applications are operational, whether the internal motion units 108,109 are operational, and so forth.

To compensate for magnetic fields that may influence measurements of the voice coil motor sensor of the imagers 106,121, in one or more embodiments the one or more processors 112 define a magnetic devices compensation engine 145 to compensate for such effects. Illustrating by example, in one or more embodiments the one or more processors 112, working with the magnetic devices compensation engine 145, determine an operating condition of the electronic device influencing one or more magnetic fields measured by a voice coil motor of the electronic device. Thereafter, the one or more processors 112 may obtain from the memory 113 of the electronic device 100, an expected voice coil motor sensor measurement 154 that is a function of the operating condition, and that compensates for the influence of the magnetic fields generated or absorbed as a function of the operating condition. The one or more processors 112 can then cause a voice coil motor driver to modify a voice coil motor drive signal until the voice coil motor sensor detects the expected voice coil motor sensor measurement 154 selected from memory. This process will be described in more detail below with reference to FIGS. 13-14.

Process engines, such as the magnetic devices compensation engine 145, can be a component of the one or more processors 112, operable with the one or more processors 112, defined by the one or more processors 112, and/or integrated into the one or more processors 112. Other configurations for these engines, including as software or firmware modules operable on the one or more processors 112, will be obvious to those of ordinary skill in the art having the benefit of this disclosure.

For instance, in addition to the magnetic devices compensation engine 145, a context engine 156 can be operable with the various sensors to detect, infer, capture, and otherwise determine persons and actions that are occurring in an environment about the electronic device 100. Where included, one embodiment of the context engine 156 can be configured to determine assessed contexts and frameworks using adjustable algorithms of context assessment employing information, data, and events. These assessments may be learned through repetitive data analysis. Alternatively, a user may employ the user interface, e.g., the display 105, to enter various parameters, constructs, rules, and/or paradigms that instruct or otherwise guide the context engine 156 in detecting multi-modal social cues, emotional states, moods, and other contextual information. The context engine 156 can comprise an artificial neural network or other similar technology in one or more embodiments.

In one or more embodiments, the context engine 156 is operable with the one or more processors 112. In some embodiments, the one or more processors 112 can control the context engine 156. In other embodiments, the context engine 156 can operate independently, delivering information gleaned from detecting multi-modal social cues, emotional states, moods, and other contextual information to the one or more processors 112. The context engine 156 can receive data from the various sensors. In one or more embodiments, the one or more processors 112 are configured to perform the operations of the context engine 156.

It is to be understood that FIG. 1 is provided for illustrative purposes only and for illustrating components of one electronic device 100 in accordance with embodiments of the disclosure, and is not intended to be a complete schematic diagram of the various components required for an electronic device. Therefore, other electronic devices in accordance with embodiments of the disclosure may include various other components not shown in FIG. 1, or may include a combination of two or more components or a division of a particular component into two or more separate components, and still be within the scope of the present disclosure.

Figure 2:
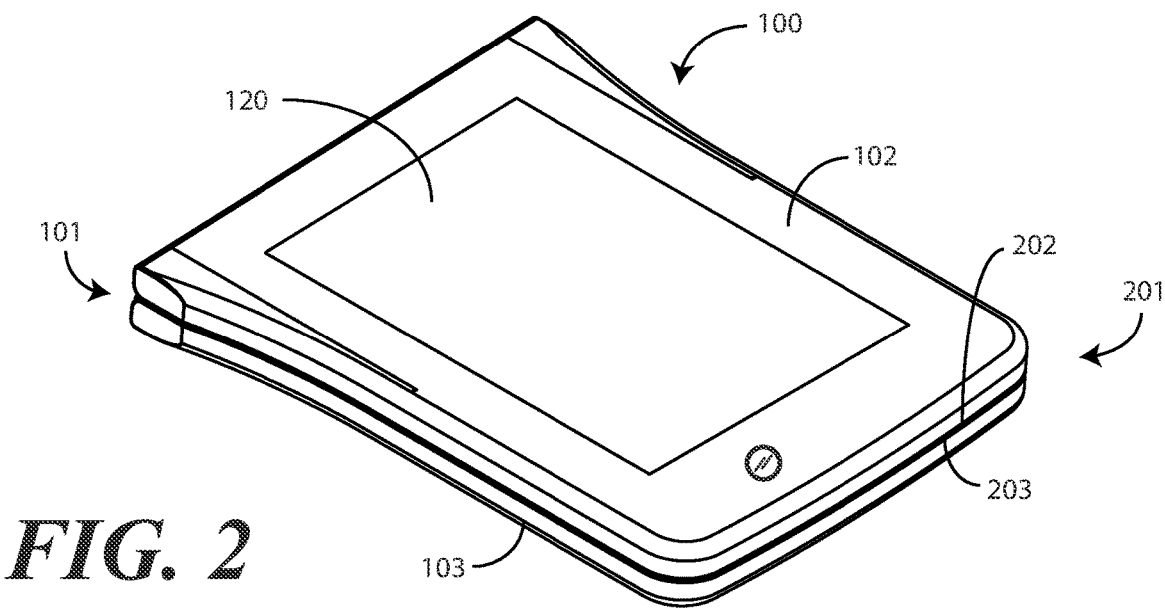
FIG. 2 illustrates one explanatory electronic device with a first device housing and a second device housing pivoted to a closed position in accordance with one or more embodiments of the disclosure.

Turning now to FIG. 2, illustrated therein is the electronic device 100 in a closed state. In this state, the first device housing 102 has been pivoted about the hinge 101 toward the second device housing 103 to a closed position 201. When in the closed position 201, a front surface 202 of the first device housing 102 abuts a front surface 203 of the second device housing 103. When in the closed position 201, the exterior display, i.e., second display 120, is visible, exposed, and accessible by a user. By contrast, when in the closed position 201, the interior display, i.e., first display (105), is concealed, is not visible, and is inaccessible by a user. Effectively, in the closed position 201 the first device housing 102 and the second device housing 103 are analogous to clam shells that have been shut by the claim, thereby giving rise to the "clamshell" style of device.

Figure 3:
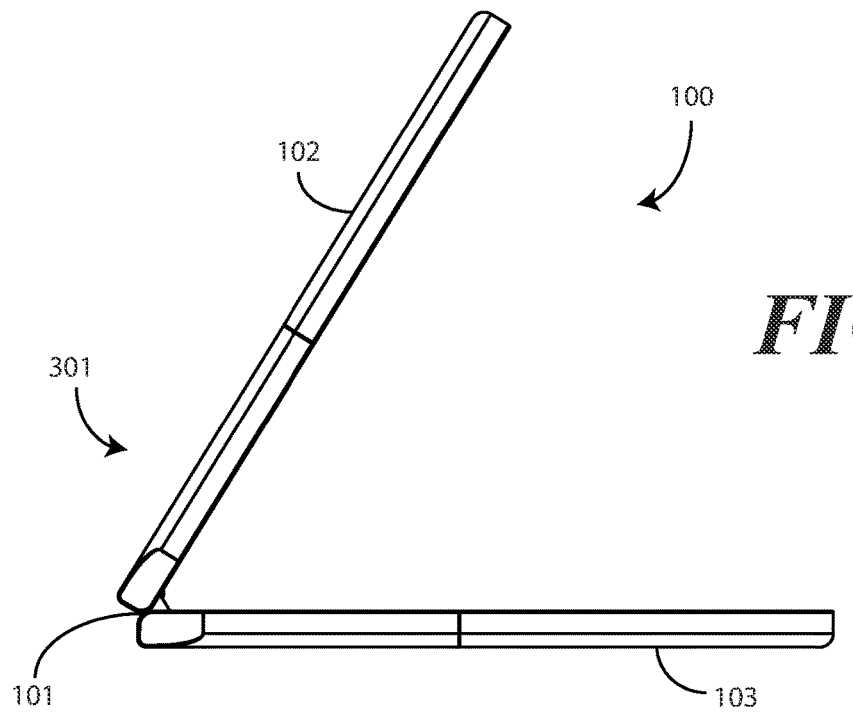
FIG. 3 illustrates one explanatory electronic device with a first device housing and a second device housing pivoted to a partially open position in accordance with one or more embodiments of the disclosure.

Turning now to FIG. 3, the electronic device 100 is shown being transitioned from the closed position (201) of FIG. 2 to a partially opened position. Specifically, the first device housing 102 is pivoting about the hinge 101 away from the second device housing 103 toward, but not fully yet to, an open position where the first device housing 102 is axially displaced about the hinge 101 from the second device housing 103. The position shown in FIG. 3 can be referred to as a "tent position" 301.

Figures 4, 5:
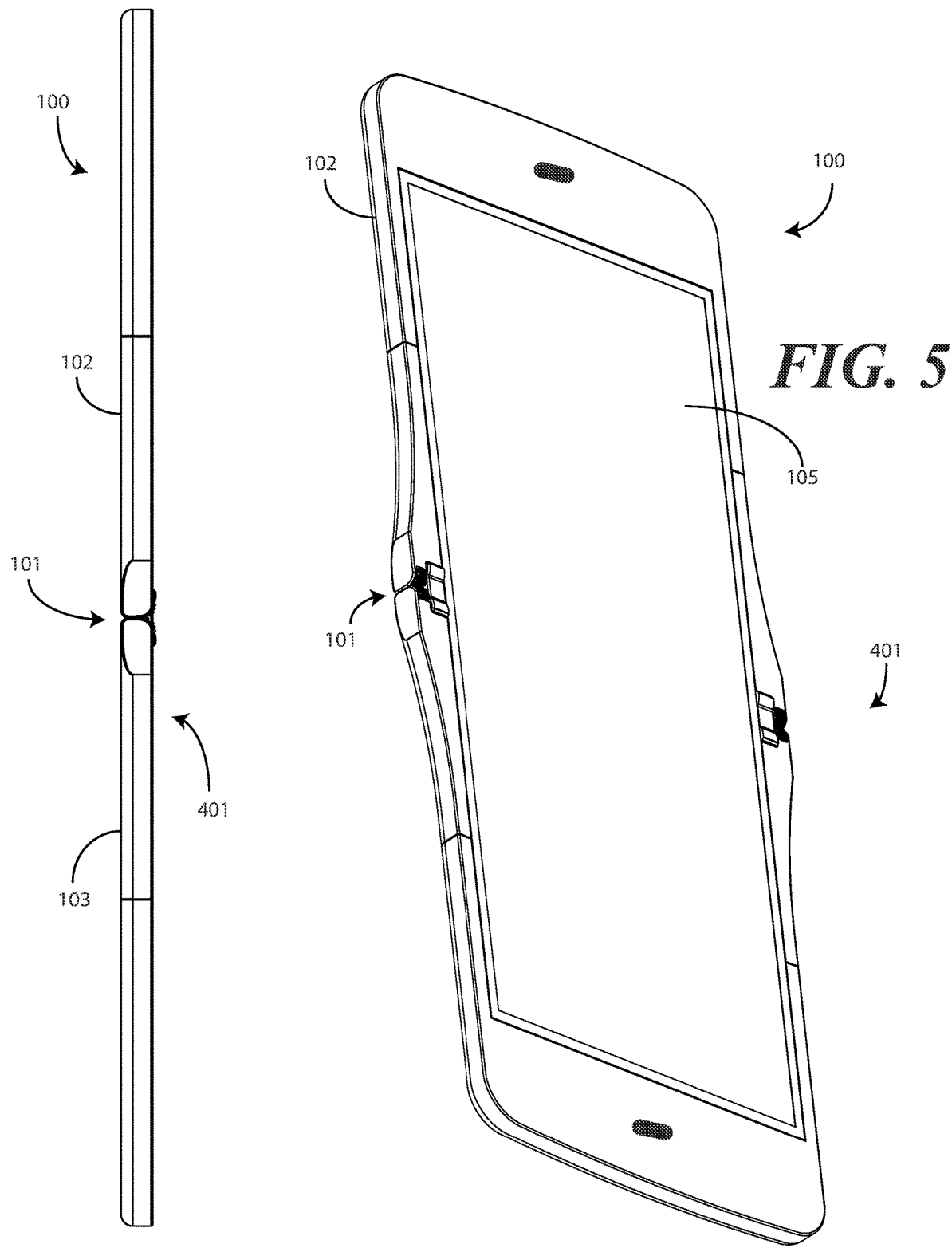
FIG. 4 illustrates one explanatory electronic device with a first device housing and a second device housing pivoted to an axially displaced open position in accordance with one or more embodiments of the disclosure.
FIG. 5 illustrates another view of one explanatory electronic device with a first device housing and a second device housing pivoted to an axially displaced open position in accordance with one or more embodiments of the disclosure.

Turning now to FIGS. 4 and 5, illustrated therein is the electronic device 100 in an axially displaced open position 401 where the first device housing 102 is rotated about the hinge 101 so as to become axially displaced from the second device housing 103. In the axially displaced open position, the first device housing 102 is rotated about the hinge 101 so as to be 180-degrees out of phase with the second device housing 103 such that the first device housing 102 and the second device housing 103 effectively define a plane. In other embodiments, the first device housing 102 and the second device housing 103 may have a small deviation from a plane. For example, the first device housing 102 and second device housing 103 may define an angle of between 170 and 175 degrees in one embodiment.

As shown in FIG. 5, the first display 105, being flexible, has been transitioned from a bent position into the elongated flat position. In one or more embodiments this occurs due to the action of one or more slidable trays (mentioned above), which can be disposed within one or both of the first device housing 102 and the second device housing 103.

Figure 6:
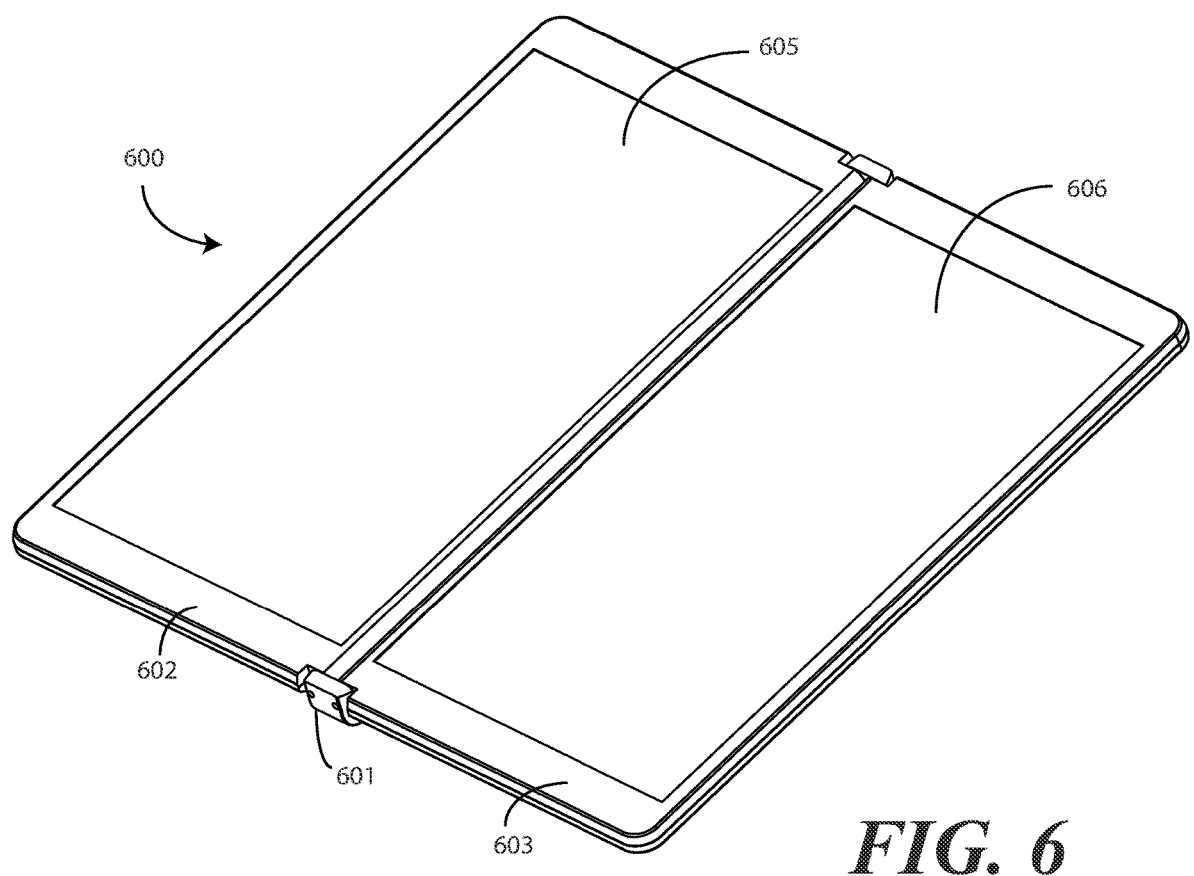
FIG. 6 illustrates another explanatory electronic device with a first device housing and a second device housing pivoted to an axially displaced open position in accordance with one or more embodiments of the disclosure.

Turning now to FIG. 6, illustrated therein is another electronic device 600 configured in accordance with one or more embodiments of the disclosure. The electronic device 600 of FIG. 6 is similar to that of FIG. 1, in that it includes a first device housing 602 and a second device housing 603, and a hinge 601. The hinge 601 couples the first device housing 602 to the second device housing 603. The first device housing 602 is pivotable about the hinge 601 relative to the second device housing 603 between an axially displaced open position and a closed position, as previously described.

In one or more embodiments, the electronic device 600 also includes an exterior display attached to one of the first device housing 602 or the second device housing 603, as previously described above with reference to second display (120) of FIG. 1. However, rather than having a flexible display, in this embodiment the electronic device 600 includes a first display 605 coupled to the first device housing 602 and a second display 606 coupled to the second device housing 603. Thus, in addition to separating the first device housing 602 from the second device housing 603, the hinge 601 separates the first display 605 from the second display 606 as well.

As with the electronic device (100) of FIGS. 1-5, in one or more embodiments the electronic device 600 of FIG. 6 includes at least one inertial motion unit (108,109) and at least one imager (106,121). In one embodiment, the electronic device 600 includes only a single inertial motion unit (108) that is situated in the first device housing 602, along with an imager (106), just as was the case with the electronic device (100) of FIG. 1. In another embodiment, the electronic device 600 optionally includes a second inertial motion unit (109) that is situated in the second device housing 603. Additional inertial motion units can be included as necessitated by a particular application, as can additional imagers.

Figure 7:
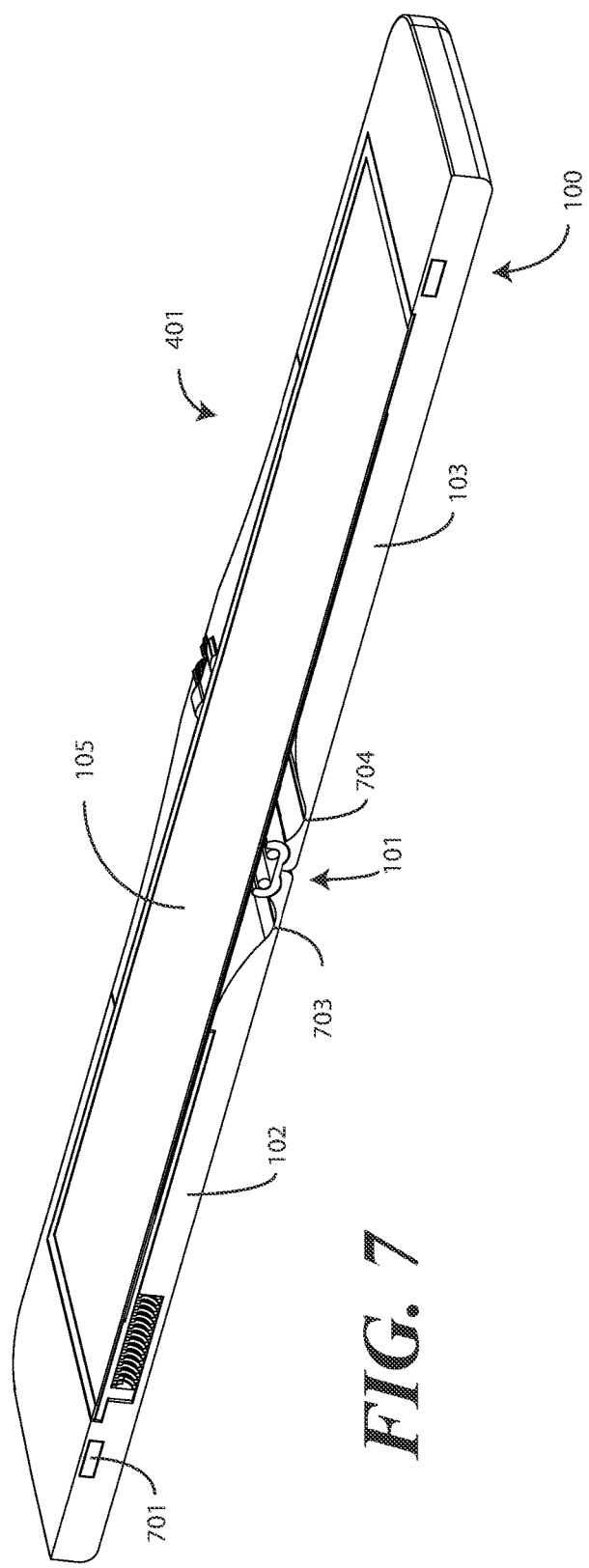
FIG. 7 illustrates a sectional view of one explanatory electronic device with a first device housing and a second device housing pivoted to an axially displaced open position in accordance with one or more embodiments of the disclosure.
Figure 8:
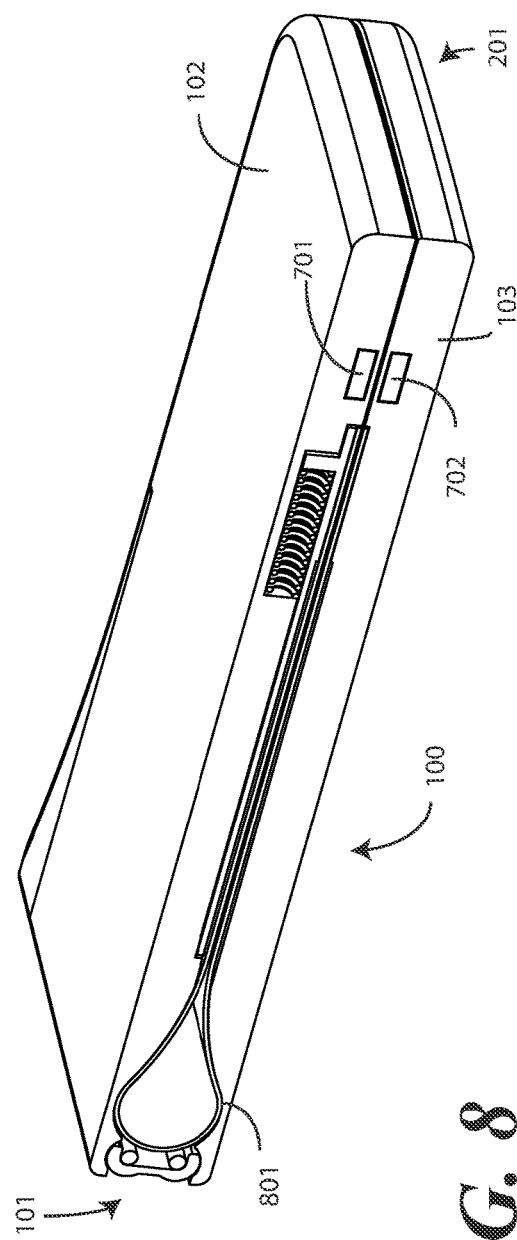
FIG. 8 illustrates a sectional view of one explanatory electronic device with a first device housing and a second device housing pivoted to a closed position in accordance with one or more embodiments of the disclosure.

Turning now to FIGS. 7-8, illustrated therein are the electronic device 100 of FIGS. 1-5 shown in a sectional view. The electronic device 100 is shown in the axially displaced open position 401 in FIG. 7, and is shown in the closed position 201 in FIG. 8. Exterior components of the electronic device 100 shown in FIG. 1 are omitted in FIGS. 7-8 for simplicity.

In one or more embodiments, features can be included to further retain the electronic device 100 in the closed position 201. Illustrating by example, in one or more embodiments a mechanical latch can be included to retain the first device housing 102 and the second device housing 103 in the closed position 201. In still other embodiments, frictional elements can be incorporated into the hinge 101 to retain the first device housing 102 and the second device housing 103 in a particular position. A stator motor could be integrated into the hinge 101 as well. Still other mechanical structures and devices suitable for retaining the electronic device 100 in the closed position 201 will be obvious to those of ordinary skill in the art having the benefit of this disclosure.

In the illustrative embodiments of FIGS. 7-8, one or more magnets 701,702 have been be incorporated the first device housing 102 and the second device housing 103 just beneath the surface of the first device housing 102 and the surface of the second device housing 103. In one or more embodiments, these magnets 701,702 are used to retain the first device housing 102 and the second device housing 103 in the closed position 201.

Also visible in FIGS. 7-8 are curvilinear recesses 703,704 that provide the flexible display 105 room to form a service loop 801 when the first device housing 102 and the second device housing 103 pivot about the hinge 101 from the axially displaced open position 401 to the closed position 201. This service loop 801 is shown in FIG. 8. This service loop 801 occurs due to the fact that the flexible display 105 deforms when the first device housing 102 pivots about the hinge 101 relative to the second device housing 103 from the axially displaced open position 401 to the closed position 201.

When the first device housing 102 and the second device housing 103 pivot about the hinge 101 to the closed position 201, the curvilinear recesses 703,704 translate radially about the hinge 101 to become exposed to, and to receive, the service loop 801 of the flexible display 105. This area for the service loop 801, which has a radius of at least five millimeters in one or more embodiments, prevents the flexible display 105 from kinking or folding. It also works to minimize mechanical memory problems when the first device housing 102 and the second device housing 103 pivot about the hinge 101 to the open position 401.

Figure 9:
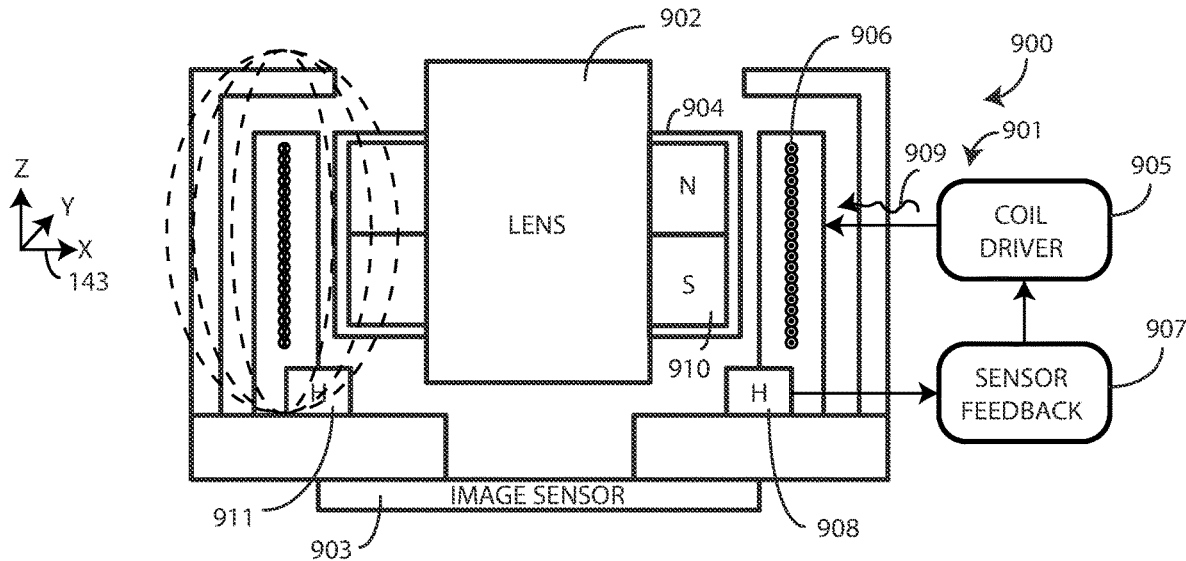
FIG. 9 illustrates one explanatory imager employing a voice coil motor in accordance with one or more embodiments of the disclosure.

Turning now to FIG. 9, illustrated therein is a sectional view of an imager 900, which could serve as one or more of imagers (106,121,128,129) of FIG. 1. The imager 900 of FIG. 9 includes a voice coil motor 901 that can translate a lens 902 relative to an image sensor 903 in three-dimensional space 143. This translation of the lens 902 can provide an autofocus function so that images created by light passing through the lens are properly focused upon the image sensor 903.

The "lens" 902 of FIG. 9 could comprise one or more lenses, but is shown as a single object in FIG. 9 for simplicity. In one or more embodiments, the lens 902 is situated within a lens barrel 904, which may be coupled to a lens carrier (not shown). In other embodiments, the lens carrier will be integral with the lens barrel 904. While shown in free space in FIG. 9 for simplicity, in practice the lens 902 may be suspended within the imager by suspension springs and/or the suspension wires. Where so configured, these springs and/or wires allow the lens 902 to have freedom of motion along each of the X, Y, and Z axes of the three-dimensional space 143 for both optical focusing and for optical image stabilization.

In one or more embodiments, the voice coil motor 901 includes a voice coil motor driver 905 that delivers a voice coil motor drive signal 909 to a voice coil motor coil 906 to provide an autofocus function for the imager 900. In one or more embodiments, the lens barrel 904 houses one or more magnets 910. When the voice coil motor driver 905 delivers the voice coil motor drive signal 909 to the voice coil motor coil 906, one or more magnetic fields are created. These magnetic fields create Lorentz forces operating kinetically upon the magnets 910 situated within the lens barrel 904, thereby translating the lens 902 in three-dimensional space 143 to focus light passing through the lens 902 upon the image sensor 903.

It should be noted that in the audio loudspeaker arts, acoustic drivers employ a floating coil coupled to an acoustic diaphragm that translates axially about—or within—a stationary magnet. The voice coil motor 901 of FIG. 9 is a bit different in that the one or more magnets 910 are attached to the lens 902 or lens barrel 904 while the voice coil motor coil 906 is held stationary. Despite this reversal of moving versus non-moving components, the engine of imager 900 is still referred to by those of ordinary skill in the art as a "voice coil motor" due to the fact that it uses a current linear actuator that resembles the system found in acoustic applications. Accordingly, that terminology is used in this specification. It should be noted, however, that other names for the voice coil motor include voice coil actuator and linear motor. Still other synonyms will be obvious to those of ordinary skill in the art having the benefit of this disclosure. Accordingly, the term "voice coil motor" is used herein to generally refer to a system where a current in a coil generates Lorentz forces relative to a magnet to cause an object, here lens 902, to move in three-dimensional space 143. In one or more embodiments, the voice coil motor 901 is used to facilitate six degrees of motion in three-dimensional space 143.

In one or more embodiments, the motion of the lens 902 caused by the magnetic fields of the voice coil motor coil 906 occurs only along the optical axis of the lens 902, which is the Z-axis of the three-dimensional space 143 of FIG. 9. In such an embodiment, the imager 900 would include the lens 902, lens barrel 904, and magnets 910 housed within the lens barrel 904, with the voice coil motor driver 905 and voice coil motor coil 906 being configured to translate the lens 902 only in the Z-direction of three-dimensional space 143. However, in other embodiments, the imager 900 is integrated into an X-Y-Z six-degrees of freedom traverse voice coil motor system, thereby allowing the lens 902 to be moved not only along the optical axis, but along in the X and Y directions of three-dimensional space 143 relative to the image sensor 903 as well. In such an embodiment, the lens 902, lens barrel 904, and magnets 910 housed within the lens barrel 904 are essentially the same, with the voice coil motor driver 905 and the voice coil motor coil 906 being integrated to facilitate X, Y, and Z movement. The former option is generally less expensive, while the latter offers increased performance and is used in some more specialized applications.

Regardless of the type of imager being used, in one or more embodiments one or more voice coil motor sensors 908 measure the magnetic fields created by the voice coil motor coil 906 to determine where the lens 902 is in three-dimensional space 143 relative to the image sensor 903. In one or more embodiments, each voice coil motor sensor 908 comprises a Hall effect sensor. The Hall effect sensor delivers signals to a sensor feedback circuit 907, which converts those signals to displacement measurements identifying elevation and X-Y displacement of the 902 relative to the image sensor 903. In one or more embodiments, the imager 900 also includes gyroscopic sensors (not shown) that deliver lens orientation signals to the sensor feedback circuit 907 as well.

In the illustrative embodiment of FIG. 9, two voice coil motor sensors 908,911 are configured to detect a position of the lens barrel 904 in which the one or more magnets 910 are situated when the voice coil motor driver 905 delivers the voice coil motor drive signal 909 to the voice coil motor coil 906, thereby creating the magnetic fields measured by the voice coil motor sensors 908,911. While two voice coil motor sensors 908,911 are shown in FIG. 9, it should be noted that the imager 900 may include more or fewer voice coil motor sensors as well. Moreover, these additional voice coil motor sensors could be positioned beneath, to the sides of, or above the voice coil motor coil 906 as required by a particular application. Regardless of configuration, by delivering output signals to the sensor feedback circuit 907, the voice coil motor 901 operates with a feedback loop allowing the lens barrel 904, and thus the lens 902, to be positioned at any of a number of distances or locations relative to the image sensor 903 as desired or required by a particular application.

When the imager 900, and more particularly the image sensor 903, captures images, signals from the image sensor 903 can be delivered to the one or more processors (112) of the electronic device (100) for processing. The voice coil motor driver 905 outputs its voice coil motor drive signal 909 to control the position of the lens 902 while this occurs. In one or more embodiments, the voice coil motor drive signal 909 is determined as a function of position data received from the one or more processors (112) based upon target position information received from the image processing analysis in conjunction with voice coil motor sensor signals received by the voice coil motor sensors 908,911, which provide an electronic device equipped with the imager 900 an autofocus function.

As can be seen from FIG. 9, imagers 900 employing voice coil motor engines employ a voice coil motor coil 906, which is frequently manufactured from copper, and one or more magnets 910 situated within a lens barrel 904 in conjunction with Lorentz forces to move the lens 902 into a desired position. Frequently, the range of motion of the lens 902 in imaging applications is less than three hundred micrometers. Moreover, in many applications the positioning accuracy of the lens 902 required for quality image capture operations is about one micrometer. It is the job of the voice coil motor sensor 908,911, which is frequently a Hall effect sensor or "Hall" sensor, to provide signals to the sensor feedback circuit 907 so that the true position of the magnets 910 situated within the lens barrel 904, and therefore the position of the lens 902 itself, can be determined in three-dimensional space 143 relative to the image sensor 903.

Embodiments of the disclosure contemplate that as portable electronic devices, such as smartphones, increase their feature sets, available "real estate" within these devices is increasingly less available. Illustrating by example, the explanatory electronic device (100) of FIG. 1 included four imagers (106,121,128,129), two displays (105,120), and other features positioned along the housing, e.g., speaker port (107) and button (164). Many smartphones manufactured today include even more equipment that can influence the magnetic fields measured by the voice coil motor sensors 908,911 of the imager 900. Some smartphones include five or more imagers, loudspeakers, haptic components (149) such as vibrators and motors, ferromagnetic materials in the form of screws, brackets, and shields, and antennas. In foldable devices, magnets and magnetic sensors can be used as hinge position sensors. As shown in FIGS. 7-8 above, in one or more embodiments an electronic device (100) can include one or more magnets (701,702) that are positioned just under interior surfaces of the first device housing (102) and second device housing (103), respectively, to assist in retaining the first device housing (102) and the second device housing (103) in the closed position. A problem the industry is currently dealing with is the fight for space within the phone.

Embodiments of the disclosure contemplate that any or all of these devices and components can, in a given operating condition of the electronic device, influence the magnetic fields measured by the voice coil motor sensors 908,911 of the imager 900. These devices and components can particularly interfere with the voice coil motor 901 by altering the magnetic fields measured by the voice coil motor sensors 908,911 through the introduction of magnetic interference in one of two ways: First, these components can exert physical forces on, for example, the one or more magnets 910 situated within the lens barrel 904. Second, these components can deliver additional magnetic fields to, or absorb magnetic fields intended for measurement by, the various voice coil motor sensors 908,911.

Embodiments of the disclosure contemplate that devices including voice coil motors, such as the imager 900 of FIG. 9, are typically designed in a proverbial "vacuum," with their manufacturers not giving much thought to their ability to withstand magnetic influence from other devices and components that may be situated within close proximity thereof in practice. This contemplation is confirmed by the fact that voice coil motor devices, including most voice coil motor imagers, are typically not well shielded from magnetic fields or magnetic field influence. Additionally, the magnetic designs are not designed to operate properly in close proximity to external devices.

Illustrating by example, if a simple earpiece receiver typically used within a smartphone is placed in close proximity to a voice coil motor imager on a frictionless surface, forces on the order of one milli-Newton delivered from the earpiece receiver to the voice coil motor imager generate forces and torques that physically move the voice coil motor imager away from the earpiece receiver. Experimental testing has demonstrated that these forces and torques will interfere with the proper operation of the voice coil motor imager in practice. When magnets (701,702) are used in an electronic device (100) that includes a first device housing (102) that is selectively pivotable about a hinge (101) relative to a second device housing (103) between an axially displaced open position (401) and a closed position (201) to hold the first device housing (102) and the second device housing (103) together in the closed position (201), the physical relationship between the magnets (701,702) and the voice coil motor sensors 908,911 can exacerbate the problem even further, as the magnetic environment surrounding the voice coil motor 901 can change based upon whether the electronic device (100) is in the axially displaced open position (401) or the closed position (201).

Figure 10:
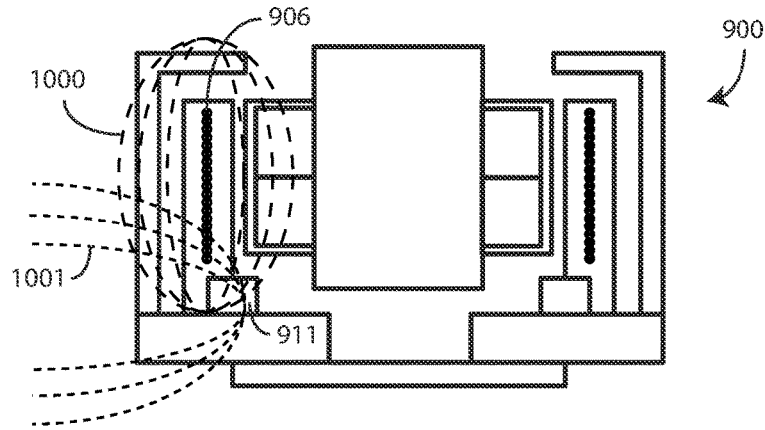
FIG. 10 illustrates one explanatory imager employing a voice coil motor sensor receiving one or more magnetic fields measured by the voice coil motor sensor when a corresponding electronic device is operating in a first operating condition.
Figure 11:
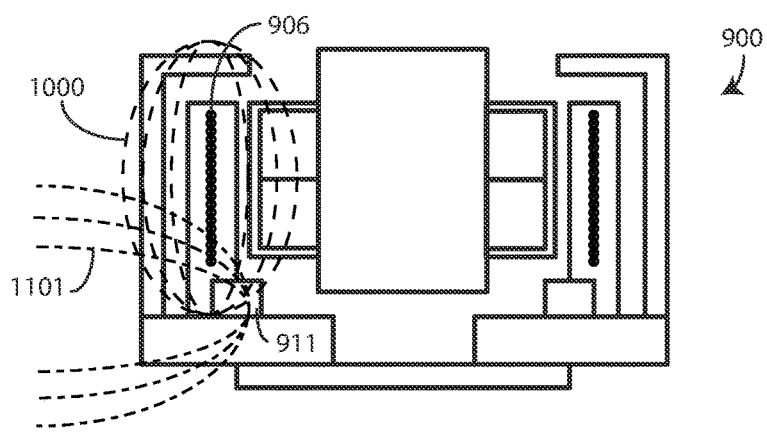
FIG. 11 illustrates one explanatory imager employing a voice coil motor sensor receiving one or more magnetic fields measured by the voice coil motor sensor when a corresponding electronic device is operating in a second operating condition.

This can be seen by comparing FIGS. 10 and 11. Beginning with FIG. 10, here the imager 900 of FIG. 9 is shown positioned in an electronic device (100) with the electronic device (100) operating in a first operating condition. For illustration, the first operating condition occurs when the first device housing (102) is pivoted about the hinge (101) relative to the second device housing (103) to the axially displaced open position (401). As shown in FIG. 7, in one or more embodiments this physically separates the magnets (701,702) configured to retain the first device housing (102) against the second device housing (103) when the electronic device (100) is in the closed position (201). In one or more embodiments, this causes one or more external magnetic fields 1001 to impinge upon the voice coil motor sensor 911, thereby influencing the one or more magnetic fields 1000 emanating from the voice coil motor coil 906 that are being measured by the voice coil motor sensor 911.

By contrast, turning now to FIG. 9, here the imager 900 is positioned within the electronic device (100) while the electronic device (100) is in a second operating condition. In this example, the second operating condition comprises the first device housing (102) being pivoted about the hinge (101) relative to the second device housing (103) to the closed position (201). As shown in FIG. 8, this causes the magnets (701,702) positioned just beneath the interior surfaces of the first device housing (102) and the second device housing (103) to be in close proximity, thereby retaining the first device housing (102) against the second device housing (103) in the closed position (201). In one or more embodiments, this causes one or more other external magnetic fields 1101 to impinge upon the voice coil motor sensor 911, thereby influencing the one or more magnetic fields 1000 emanating from the voice coil motor coil 906 that are being measured by the voice coil motor sensor 911.

Figures 12, 13:
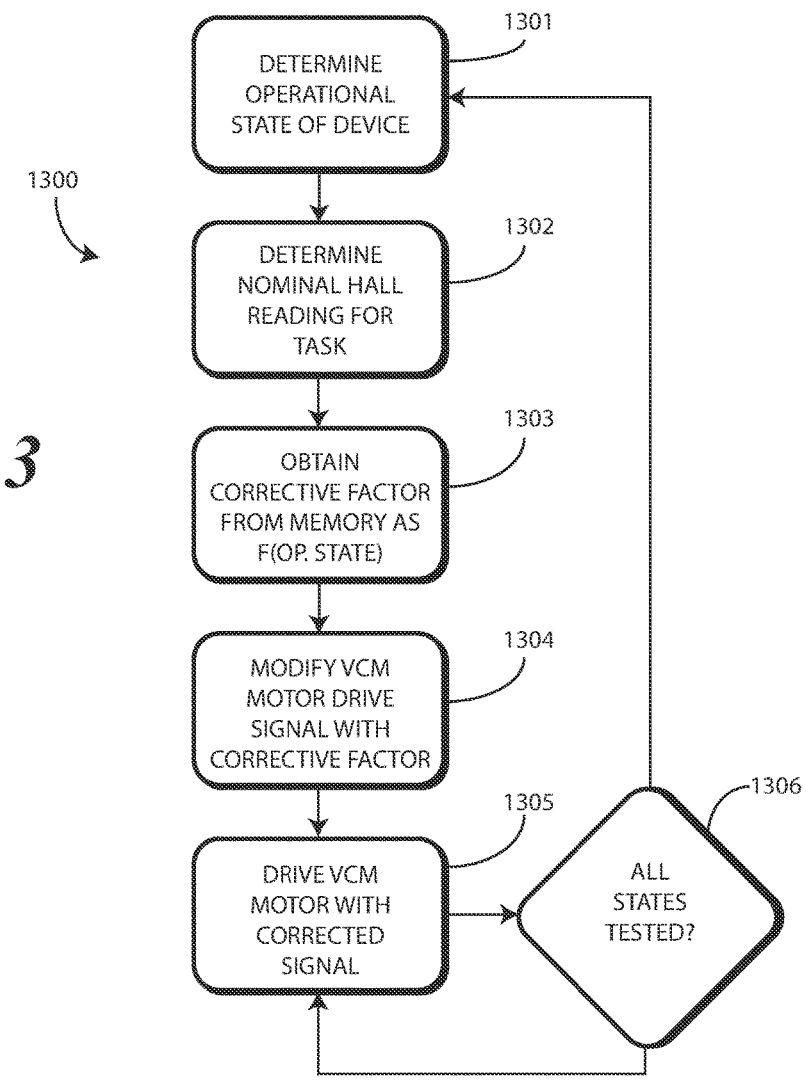
FIG. 12 illustrates a table illustrating how one or more magnetic fields can influence signals measured by a voice coil motor sensor in accordance with one or more embodiments of the disclosure.
FIG. 13 illustrates one explanatory method in accordance with one or more embodiments of the disclosure.

The effects of just these two simple operating conditions, which do not take into account all of the other ways that the magnetic fields 1000 being measured by the voice coil motor sensor 911 could be influenced, e.g., by the positioning of physical components such as imagers, loudspeakers, haptic components (149) such as vibrators and motors, ferromagnetic materials in the form of screws, brackets, and shields, and antennas, or the operation of various applications or components of the electronic device (100), can be seen in FIG. 12.

Turning now to FIG. 12, a table 1200 illustrating only the effects of the "axially displaced open position" operating condition and the "closed position" operating condition are shown. Under laboratory conditions where the imager (900) is isolated, when the lens (902) of the imager (900) is positioned in a particular location, there is a force of −5.1 milli-Newtons applied to the magnets (910) situated within the lens barrel (904) in the X-dimension of three-dimensional space (143), while a force of 6.9 milli-Newtons is applied to those magnets (910) in the Y-dimension of three-dimensional space (143). A −20.8 milli-Newton force is applied along the Z-dimension, while the voice coil motor sensor (911), which is a Hall sensor in this example, measures 1497 micro-Tesla.

However, when the imager (900) is positioned within the electronic device (100) of FIGS. 1-5 and 7-8, and the first device housing (102) is pivoted about the hinge (101) relative to the second device housing (103) to the axially displaced open position (401), things change quite dramatically. To wit, when the lens (902) of the imager (900) is positioned at the same location, there is now a force of −5.6 milli-Newtons applied to the magnets (910) situated within the lens barrel (904) in the X-dimension of three-dimensional space (143), which represents almost a ten percent increase in force. A force of 6.8 milli-Newtons is applied to those magnets (910) in the Y-dimension of three-dimensional space (143), rather than the 6.9 applied in isolation. A −21.5 milli-Newton force is applied along the Z-dimension, which represents a 3.3 percent increase in force. The voice coil motor sensor (911) now measures 1495 micro-Tesla, rather than the 1497 read under laboratory conditions.

Now, when the first device housing (102) is then pivoted about the hinge (101) relative to the second device housing (103) from the axially displaced open position (401) to the closed position (201), things change again. When the lens (902) of the imager (900) is positioned at the same location, there is now a force of −6.6 milli-Newtons applied to the magnets (910) situated within the lens barrel (904) in the X-dimension of three-dimensional space (143), which represents almost a thirty percent increase in force compared to the control. A force of 6.7 milli-Newtons is applied to those magnets (910) in the Y-dimension of three-dimensional space (143), rather than the 6.9 applied in isolation. A −21.5 milli-Newton force is again applied along the Z-dimension, which represents a 3.3 percent increase in force. The voice coil motor sensor (911) now measures 1488 micro-Tesla, which represents more than a half percent change from laboratory conditions. Recall that the accuracy for most imaging applications needs to be within one micrometer for the lens (902).

These changes come from the influence of the magnets (701,702) as measured by the voice coil motor sensors (908,911) depending upon whether the electronic device (100) is in the axially displaced open position (401) or the closed position (201). For instance, when the electronic device (100) is in the axially displaced open position (401), the voice coil motor sensors (908,911) measure predominantly the magnetic fields (1000) from the voice coil motor coil (906), as well as those created by the magnet closest to the voice coil motor sensor (908,911). (If the imager (900) is positioned as imager (106), for example, the voice coil motor sensors (908,911) would measure magnet (701) when the electronic device (100) is in the axially displaced open position (401).) By contrast, when the electronic device (100) is in the closed position (201) the same voice coil motor sensors (908,911) measure the magnetic fields created by both magnets (701,702), which causes increased influence of the measurement of the magnetic fields (1000) generated by the voice coil motor coil (906).

It should be noted that while the voice coil motor sensor measurements decrease due to this influence in FIG. 12, it is possible that in other applications the operating condition occurring when the electronic device (100) is in the axially displaced open position (401) or the closed position (201) could either increase or decrease the voice coil motor sensor measurements depending on the polarity/strength/orientation of the magnets (701,702) as well as what other physical or electronically operational components are influencing the magnetic fields being measured by the voice coil motor sensors (908,911). Accordingly, the measured voice coil motor sensor measurements may be above or below the control in such applications.

Advantageously, embodiments of the disclosure compensate for this deviation caused by operating conditions of the electronic device (100) influencing the magnetic fields measured by the voice coil motor sensors (908,911). Specifically, by determining what operating condition the electronic device is in, in one or more embodiments one or more processors (112) of the electronic device (100) can determine an expected a voice coil motor correction factor required to compensate for this influence. This voice coil motor correction factor can be used to obtain an expected voice coil motor sensor measurement to position the lens (902) in a desired position while the operating condition is occurring. Thereafter, the one or more processors (112) can cause the voice coil motor driver (905) to modify the voice coil motor drive signal (909) until the voice coil motor sensors (908,911) measure or detect the expected voice coil motor sensor measurement, thereby compensating for the operating condition's occurrence. Advantageously, embodiments of the disclosure provide systems, models, look-up tables, and calibration methods allowing the one or more processors (112) of an electronic device (100) to compensate for interference of a voice coil motor (901) without rendering the voice coil motor sensor feedback circuit (907) incapacitated or unable to produce proper movement and positioning of the lens (902) of an imager (900).

Now that various hardware components of various electronic devices have been described, attention will be turned to methods of using electronic devices in accordance with one or more embodiments of the disclosure. Turning now to FIG. 13, illustrated therein is one such method 1300 demonstrating how this can occur in accordance with one or more embodiments of the disclosure. Alternate methods will be described thereafter with reference to subsequent figures.

Beginning at step 1301, one or more processors of an electronic device determine an operating condition of the electronic device influencing one or more magnetic fields measured by a voice coil motor sensor of the electronic device. In one or more embodiments, the voice coil motor sensor is situated within an imager, and is configured to measure magnetic fields created by a voice coil motor coil so that a voice coil motor sensor feedback circuit can accurately facilitate the positioning of a lens of the imager in three-dimensional space.

At step 1302, the method 1300 determines a nominal voice coil motor sensor reading for a particular condition. Illustrating by example, the imager is situated within an electronic device under coil conditions and is capturing an image ten feet from the electronic device, the one or more processors may cause a voice coil motor driver to apply a drive signal causing the lens of the imager to move to location X1, Y1, Z1.

However, when step 1301 determines that the electronic device is not operating under control conditions, and is instead operating in a predefined operating condition that should influence the magnetic fields measured by the voice coil motor sensor, at step 1303 the one or more processors may obtain from a memory of the electronic device an expected voice coil motor sensor measurement. In one or more embodiments, the expected voice coil motor sensor measurement is a function of the operating condition determined at step 1301.

Illustrating by example, if step 1301 indicates that the operating condition of the electronic device comprises a first device housing being pivoted about a hinge relative to a second device housing to an axially displaced open position, the expected voice coil motor sensor measurement may include a correction factor due to the fact that the voice coil motor sensor is measuring not only the magnetic fields from the voice coil motor coil, but also those of a magnet used to retain the first device housing against the second device housing in the closed position. Accordingly, the expected voice coil motor sensor measurement selected at this step 1303 may be that of, say, 1495 micro-Tesla, rather than the 1497 micro-Tesla selected for the X1, Y1, Z1 location at step 1302.

Similarly, if step 1301 indicates that the operating condition of the electronic device comprises the first device housing being pivoted about the hinge relative to the second device housing to the closed position, the one or more processors may select a different expected voice coil motor sensor measurement at step 1303 due to the fact that the voice coil motor sensor is measuring not only the magnetic fields from the voice coil motor coil, but also those of both magnets used to retain the first device housing against the second device housing in the closed position. Accordingly, the expected voice coil motor sensor measurement selected at this step 1303 may be that of, say, 1488 micro-Tesla, rather than the 1497 micro-Tesla selected for the X1, Y1, Z1 location at step 1302. It should be noted that these two operating conditions are illustrative only. Numerous others will be obvious to those of ordinary skill in the art having the benefit of this disclosure, especially in view of the myriad of components described above with reference to FIG. 1, as well as those obvious to those of ordinary skill in the art, can each be used alone or in combination, and with some electronic devices positioned in an axially displaced open position, a closed position, or therebetween.

At step 1304, the one or more processors cause a voice coil motor driver to modify a voice coil motor drive signal until the voice coil motor sensor detects the expected voice coil motor sensor measurement selected at step 1303. The modified voice coil motor drive signal is then delivered to the voice coil motor coil at step 1305. By causing this modification of the voice coil motor drive signal, the voice coil motor driver compensates for the operating condition of the electronic device.

In one or more embodiments, this modification of the voice coil motor drive signal continues so long as the operating condition of the electronic device occurs. Said differently, in one or more embodiments the one or more processors of the electronic device cause the voice coil motor driver to modify the voice coil motor drive signal until the operating condition ceases. Illustrating by example, decision 1306 can determine whether the operating condition detected at step 1301 ceases or changes to a new operating condition. Where it does not, the modified voice coil motor drive signal can continue being delivered to the voice coil motor coil at step 1305. Where the result of influence upon the magnetic fields being measured by the voice coil motor is similar to that shown above in FIG. 12, step 1305 can comprise the voice coil motor driver modifying the voice coil motor drive signal by increasing the voice coil motor drive signal such that the measurements of the voice coil motor sensor increase from those ordinarily made during the operating condition to those of the control. In one or more embodiments, this step 1305 positions a lens of the imager in three-dimensional space relative to an image sensor of the imager.

However, where any of the following occur: (1) the lens of the imager needs to move as a function of the application controlling the imager, (2) the operating condition ceases, or (3) the operating condition initially detected at step 1301 changes to a second, third, fourth, or other operating condition, the method 1300 can repeat. To wit, step 1301 can comprise the one or more processors determining another operating condition of the electronic device influencing the one or more magnetic fields measured by the voice coil motor sensor of the imager, while step 1303 comprises the one or more processors obtaining from a memory of the electronic device, another expected voice coil motor sensor measurement that is another function of the newly detected operating condition. Step 1304 can comprise the one or more processors causing the voice coil motor driver to modify the voice coil motor drive signal until the voice coil motor sensor detects the new expected voice coil motor sensor measurement, thereby compensating for the new operating condition, and so forth. In one or more embodiments, this step 1305 again positions a lens of the imager in three-dimensional space relative to an image sensor of the imager. The method 1300 can then repeat for as long as operating conditions of the electronic device continue to change.

When applied in, for example, the electronic device (100) of FIG. 1, the method 1300 of FIG. 13 allows for dynamic and continuous compensation of any operating conditions influencing magnetic fields measured by a voice coil motor sensor (908,911) of any imager (106,121,128,129) or of any other component operating in the electronic device (100). Illustrating by example, in one or more embodiments an electronic device (100) includes a device housing, which may be singular or, like that of the electronic device (100) of FIG. 1, may include a first device housing (102) and a second device housing (103) coupled by a hinge (101). The device housing can support an imager (106,121,128,129).

In one or more embodiments, the imager comprises a lens (902) and an image sensor (903), with a voice coil motor (901) positioning the lens (902) in three-dimensional space (143) relative to the image sensor (903). A voice coil motor driver (905) can deliver a voice coil motor drive signal (909) to the voice coil motor (901), with a voice coil motor sensor (908,911) operable to detect a drive state of the voice coil motor (901), responsive to the voice coil motor drive signal (909), by measuring one or more magnetic fields (1000) generated by a voice coil motor coil (906).

In one or more embodiments, one or more processors (112) of the electronic device (100) determine an operating condition of the electronic device (100) influencing the one or more magnetic fields being measured by the voice coil motor sensor (908,911). The one or more processors (112) can then retrieve an expected voice coil motor sensor measurement from a memory (113) of the electronic device (100) that is a function of the operating condition of the electronic device (100). The one or more processors (112) can thereafter cause the voice coil motor driver (905) to modify the voice coil motor drive signal (909) until the voice coil motor sensor (908,911) obtains by measurement the expected voice coil motor sensor measurement.

As noted above, in one or more embodiments the operating condition can comprise the first device housing (102) being pivoted about the hinge (101) relative to the second device housing (103) to the axially displaced open position (401), or alternatively to the closed position (201). Moreover, in one or more embodiments the voice coil motor driver (905) can continue modifying the voice coil motor drive signal (909) until the operating condition ceases. Where the voice coil motor sensor (908,911) comprises a Hall effect sensor, the expected voice coil motor sensor measurement can compensate for a magnetic noise offset, e.g., 1, 2, 3, 4, or more micro-Tesla, occurring due to the operating condition of the electronic device. Where the affects occur as depicted above in FIG. 12, this may result in the one or more processors (112) causing the voice coil motor driver (905) to increase the voice coil motor drive signal (909) until the voice coil motor sensor (908,911) obtains the expected voice coil motor sensor measurement, and so forth.

As noted above, the operating conditions of the electronic device can be many and varied. There can be standard operating conditions that are expected. Examples include the first device housing (102) and second device housing (103) being pivoted to the axially displaced open position (401) or closed position (201), those states with the haptic components 149 ON or OFF, those states with the loudspeaker (134) ON or OFF, or combinations thereof.

There can be unique operating conditions as well. Illustrating by example, given that the use scenario of taking photos, either with the electronic device (100) oriented in a portrait or landscape orientation in three-dimensional space (143), for a right-handed user the right hand is generally at the bottom or right of the electronic device (100) so that a user actuation target or button can be pressed. This leaves the left hand is on top of the electronic device (100), toward the back, and therefore near the imager (106). Further, more users than not who wear rings place them on their left hand fingers. Jewelry can be of different metals, and if any is magnetic it could influence magnetic fields being measured by a voice coil motor sensor (908,911) of an imager. In one or more embodiments, expected voice coil motor sensor measurements can be determined for any such scenario. On the application of the voice coil motor drive signal (909), the voice coil motor sensor (908,911) is going to expect to read a certain quantity, but because of the operating condition it does not. In that instance, one or more processors (112), optionally using one or more sensors (135) of the electronic device (100), can infer an external interference and correct it by selecting an expected voice coil motor sensor measurement and causing the voice coil motor driver (905) to modify the voice coil motor drive signal (909), e.g., driving the current up/down for each degree of freedom, until the voice coil motor sensor (908,911) measures the expected voice coil motor sensor measurement. Because such operating conditions can be simulated, and because the one or more processors (112) can detect the operating states of each component of the electronic device (100), a look-up table can be derived to represent the various expected voice coil motor sensor measurements as a function of the various operating conditions.

Figures 14, 15, 16:
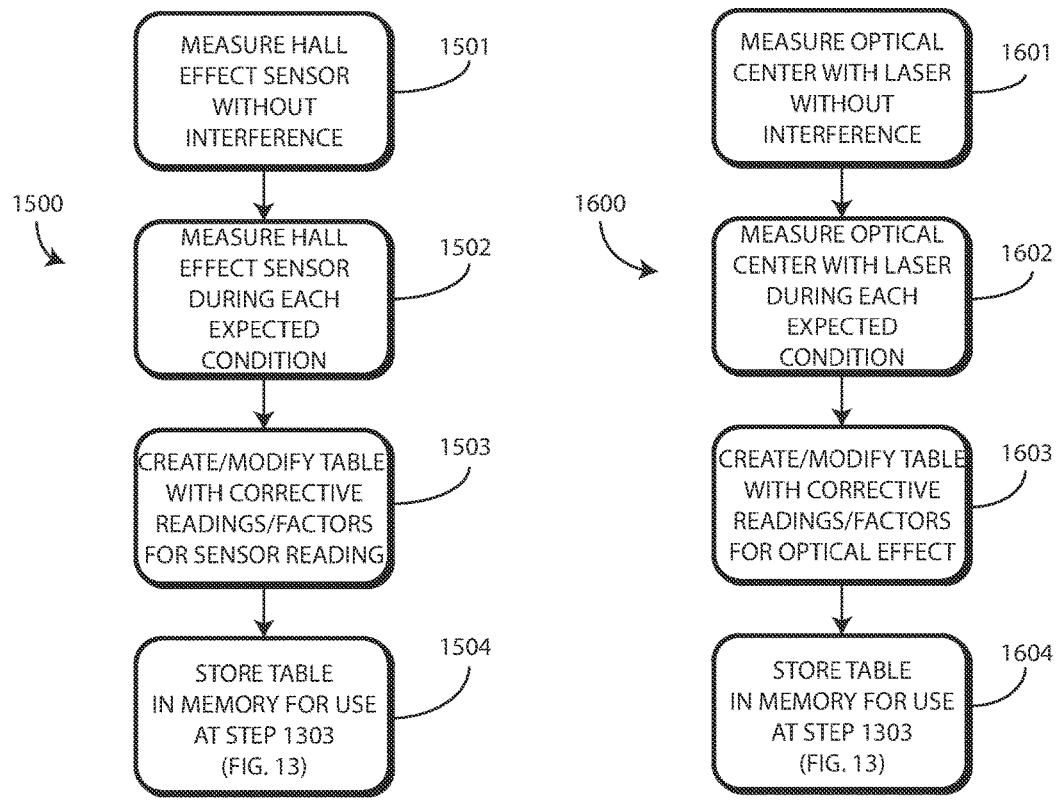
FIG. 14 illustrates one explanatory compensation table suitable for storing in a memory of an electronic device in accordance with one or more embodiments of the disclosure.
FIG. 15 illustrates another explanatory method in accordance with one or more embodiments of the disclosure.
FIG. 16 illustrates still another explanatory method in accordance with one or more embodiments of the disclosure.

In the description of FIG. 13, one explanatory operating condition comprises a first device housing of the electronic device being pivoted about a hinge of the electronic device relative to a second device housing of the electronic device from a closed position, where the first device housing is retained to the second device housing by one or more magnets, to an axially displaced open position. However, ferromagnetic components coming into—or moving out of—proximity of a voice coil motor can create other operating conditions. The operation of communication devices, haptic devices, electronic components generating magnetic fields, various device applications, and other operational factors in an electronic device can also influence the magnetic fields being measured by a voice coil motor sensor, be it in as part of an voice coil motor in an imager or a voice coil motor in another component. Accordingly, in one or more embodiments a memory of the electronic device can store a lookup table in the memory so that the expected voice coil motor sensor measurement selected at step 1303 can be selected as a function of the operating condition. Turning now to FIG. 14, illustrated therein is one such look-up table 1400.

As shown in FIG. 14, the look-up table 1400 includes a tabulation of a plurality of operating conditions 1401. These operating conditions 1401 can include physical manipulations of the electronic device, such as whether the first device housing is pivoted about a hinge relative to a second device housing to an axially displaced open position or a closed position, whether a person is holding a particular location of the electronic device, whether the electronic device is in a ferrous metal container, situated on a ferrous metal surface, or in another state. Alternatively, the operating conditions 1401 can include active and inactive states of the electronic device, such as whether communication devices are transceiving data, whether displays or loudspeakers are active, whether mechanical switches are being actuated, and so forth. Of course, the physical conditions and operable states of components can occur alone or in combination. Accordingly, the list of operating conditions 1401 can be quite extensive. However, using one or more sensors or other components of the electronic device, including those described above with reference to FIG. 1, one or more processors of the electronic device can determine the operating condition of the electronic device at a given point in time.

Since the operating condition of the electronic device can be determined, in one or more embodiments, the one or more processors can then select a corrective reading factor 1402 corresponding to, or as a function of, the detected operating condition. In one or more embodiments, the corrective reading factor 1402 comprises an expected voice coil motor sensor measurement. Illustrating by example, the corrective reading factor 1402 may indicate that a voice coil motor sensor should measure 1488 micro-Tesla, rather than 1495 micro-Tesla, as previously described.

In another embodiment, the corrective reading factor 1402 may be a voice coil motor correction factor. For instance, if the voice coil motor sensor should measure 1488 micro-Tesla, rather than 1495 micro-Tesla, the voice coil motor correction factor may be −7 micro-Tesla, and so forth.

As shown in FIG. 14, the look-up table 1400 can include corrective reading factors 1402 for various positions of the lens in an imager. Where, for example, the voice coil motor is integrated in an imager, embodiments of the disclosure contemplate that the lens of the imager can be positioned at any of a number of locations within its 300 micrometer (or more) dynamic range relative to the image sensor. It may be positioned at a first position to focus on an object far in its field of view, or at a second position to focus on an object close within its field of view, or somewhere between. Accordingly, in one or more embodiments each corrective reading factor 1402 can be recorded for each of a plurality of positions 1403,1404,1405 of the lens of the imager. Accordingly, in one or more embodiments the one or more processors of the electronic device determine not only the operating condition of the electronic device, but the desired position of the lens of the imager relative to the image sensor, and then select the appropriate corrective reading factor 1402 from the look-up table accordingly to compensate for influence upon the magnetic fields being measured by the voice coil motor sensor that occur due to the operating condition of the electronic device occurring.

The look-up table 1400 of FIG. 14 can be created in a variety of ways. FIGS. 15 and 16 illustrate two methods 1500,1600 for creating the look-up table 1400 of FIG. 14. Others will be obvious to those of ordinary skill in the art having the benefit of this disclosure. The method 1500 of FIG. 15 can be referred to as a "voice coil motor sensor" method of correction, while the method 1600 of FIG. 16 can be referred to as an "optical center of the image sensor" method of correction. Of course, the method 1500 of FIG. 15 and the method 1600 of FIG. 16 can be used alone. However, as will be shown below with reference to FIG. 19, these methods 1500,1600 can be used in combination as well.

Effectively, the method 1500 of FIG. 15 measures signals received by a voice coil motor sensor in a control setting, where external devices do not influence magnetic fields measured by the voice coil motor sensor. Thereafter, the method 1500 measures signals received by the voice coil motor sensor when external devices in an operating condition of an electronic device do influence magnetic fields measured by the voice coil motor sensor. From the differences between these measurements, the look-up table 1400 of FIG. 14 can be created. Thereafter, the one or more processors of an electronic device can determine an operating condition of the electronic device influencing one or more magnetic field measured by the voice coil motor sensor, retrieve an expected voice coil motor sensor measurement from look-up table 1400 stored in the memory that is a function of the operating condition of the electronic device, and can cause the voice coil motor driver to modify the voice coil motor drive signal until the voice coil motor sensor obtains the expected voice coil motor sensor measurement.

Effectively, the method 1600 of FIG. 16 measures an optical center of the image sensor, such as by using a laser aligned with the optical center when external devices do not influence magnetic fields measured by the voice coil motor sensor. The method 1600 then measures where the laser falls on the image sensor when external devices in an operating condition of an electronic device do influence magnetic fields measured by the voice coil motor sensor. From the differences between these measurements, the look-up table 1400 of FIG. 14 can be created. The voice coil motor drive signal can then optionally be modified to cause the lens of the imager to return the laser light, as passed by the lens, to the actual optical center, thereby providing a confirmation of the voice coil motor measurement required to compensate for the shift in optical center due to the fact that external devices in an operating condition of an electronic device do influence magnetic fields measured by the voice coil motor sensor. Thereafter, the one or more processors of an electronic device can determine an operating condition of the electronic device influencing one or more magnetic field measured by the voice coil motor sensor, retrieve an expected voice coil motor sensor measurement from look-up table 1400 stored in the memory that is a function of the operating condition of the electronic device, and can cause the voice coil motor driver to modify the voice coil motor drive signal until the voice coil motor sensor obtains the expected voice coil motor sensor measurement.

Beginning with FIG. 15, at step 1501 the method 1500 obtains, with a voice coil motor sensor, a first voice coil motor sensor measurement when the electronic device is in a first operating condition. In one or more embodiments, the first operating condition is one where components, systems, objects, devices, and applications of the electronic device do not influence magnetic fields generated by a voice coil motor coil being measured by the voice coil motor sensor.

At step 1502, the method obtains, with the voice coil motor sensor, a second voice coil motor sensor measurement when the electronic device is operating in a second operating condition. In one or more embodiments, the second operating condition is one where components, systems, objects, devices, and applications of the electronic device do influence magnetic fields generated by a voice coil motor coil being measured by the voice coil motor sensor.

At step 1503, one or more processors operable with the voice coil motor sensor calculate a voice coil motor correction factor as a function of the first operating condition and the second operating condition. Illustrating by example, if the voice coil motor measures 1497 micro-Tesla at step 1501, but only measures 1495 micro-Tesla at step 1502, step 1503 may comprise the one or more processors determining that −2 micro-Tesla is the voice coil motor correction factor.

At step 1504, the one or more processors record the voice coil motor correction factor in a memory of the electronic device. In one or more embodiments, the voice coil motor correction factor can be recorded in a look-up table as a function of one or both of the operating condition and/or a predefined position of a lens barrel housing one or more magnets and positioned about a lens of an imager. In one or more embodiments, the method 1500 of FIG. 15 can be repeated for various operating conditions and lens positions to generate, via repeated instances of step 1504, a look-up table similar to that described above with reference to FIG. 14.

Figure 17:
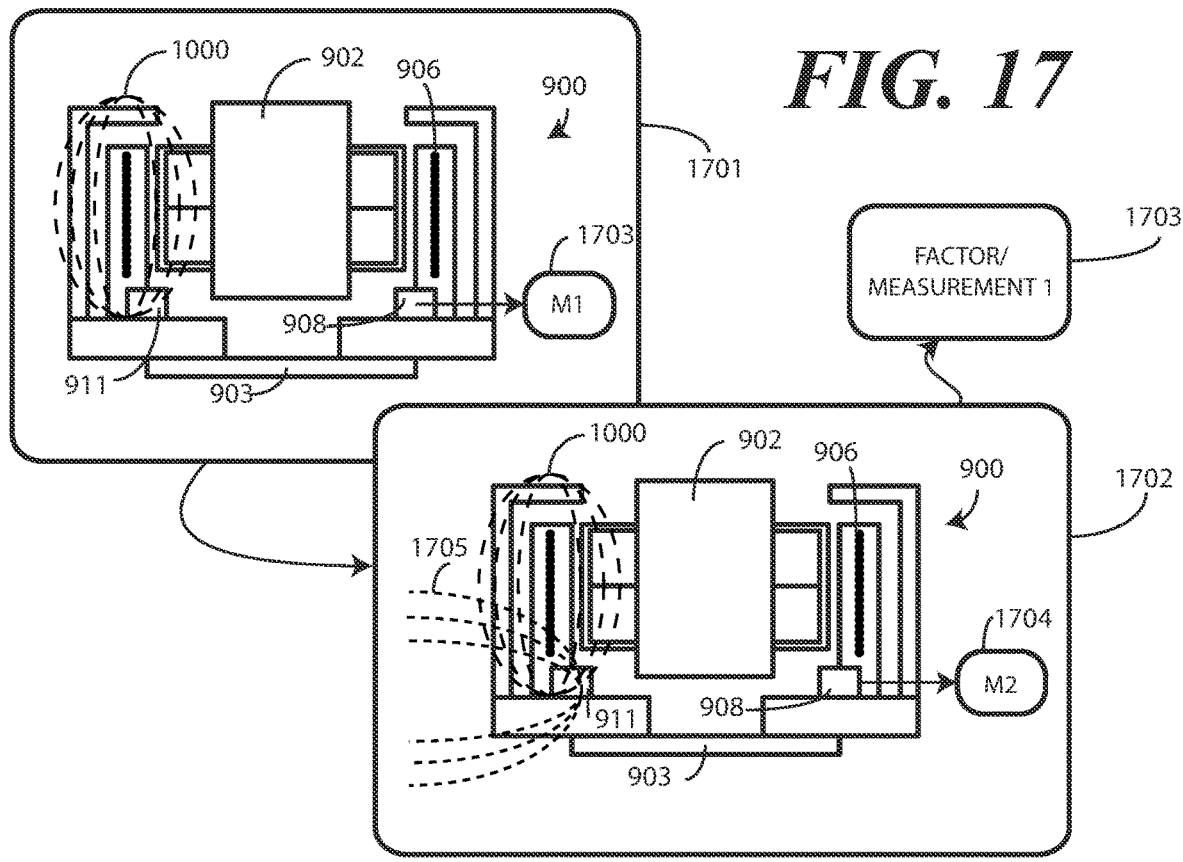
FIG. 17 illustrates one or more method steps for determining a voice coil motor sensor correction factor in accordance with one or more embodiments of the disclosure.

Turning briefly to FIG. 17, the method (1500) of FIG. 15 is illustrated pictorially. At step 1701, measurements 1706 of the voice coil motor sensors 908,911 are taken while a voice coil motor coil 906 generate one or more magnetic fields 1000 by positioning a lens 902 of an imager 900 at a predefined location in three-dimensional space relative to an image sensor 903. At 1701, the measurements are taken while components, systems, objects, devices, and applications of the electronic device into which the imager 900 is integrated do not influence the magnetic fields 1000 generated by the voice coil motor coil 906.

At step 1702, measurements 1704 of the voice coil motor sensors 908,911 are again taken while a voice coil motor coil 906 generate one or more magnetic fields 1000 by positioning a lens 902 of an imager 900 at a predefined location in three-dimensional space relative to an image sensor 903. At 1702, components, systems, objects, devices, and applications of the electronic device into which the imager 900 is integrated influence the magnetic fields 1000 generated by the voice coil motor coil 906, either by delivering additional magnetic fields 1705 to the voice coil motor sensors 908,911 or by absorbing the magnetic fields 1000 generated by the voice coil motor coil 906. In one or more embodiments, the measurement 1704 of step 1702 are taken when the components, systems, devices, and applications of the electronic device are OFF, but are physically located at a predefined geometric relationship to the voice coil motor sensors 908, 911. In other embodiments, the components, systems, devices, and applications of the electronic device are ON. Of course, a combination of these techniques could be used as well.

At step 1703, the one or more processors of the electronic device calculate a voice coil motor correction factor required to eliminate the influence upon the magnetic fields 1000 being measured by the voice coil motor sensors 908,911 due to the second operating condition occurring. In one or more embodiments, step 1703 comprises developing a table of voice coil motor correction factors that correlates the interfered voice coil motor sensor readings with the true movement of the lens 902 in three-dimensional space.

Turning now back to FIG. 16, at step 1601 the method determines, with an image sensor, an optical center when the electronic device is in a first operating condition. In one or more embodiments, this step 1601 occurs while components, systems, objects, devices, and applications of the electronic device do not influence magnetic fields generated by a voice coil motor coil being measured by the voice coil motor sensor.

At step 1602, the method 1600 transitions, using one or more processors of the electronic device, the electronic device to a second operating condition where components, systems, objects, devices, and applications of the electronic device do influence magnetic fields generated by a voice coil motor coil being measured by the voice coil motor sensor. In one or more embodiments, this second operation condition causes a deviation in the optical center due to the fact that the second operating condition causes the lens to move.

In one or more embodiments, step 1603 comprises calculating, using the one or more processors, a voice coil motor correction factor required to eliminate the deviation in the optical center while the second operating condition is occurring. At step 1604, the one or more processors store the voice coil motor correction factor determined at step 1603 in a memory of the electronic device. In one or more embodiments, the voice coil motor correction factor can be recorded in a look-up table as a function of one or both of the operating condition and/or a predefined position of a lens barrel housing one or more magnets and positioned about a lens of an imager. In one or more embodiments, the method 1600 of FIG. 16 can be repeated for various operating conditions and lens positions to generate, via repeated instances of step 1604, a look-up table similar to that described above with reference to FIG. 14.

Figure 18:
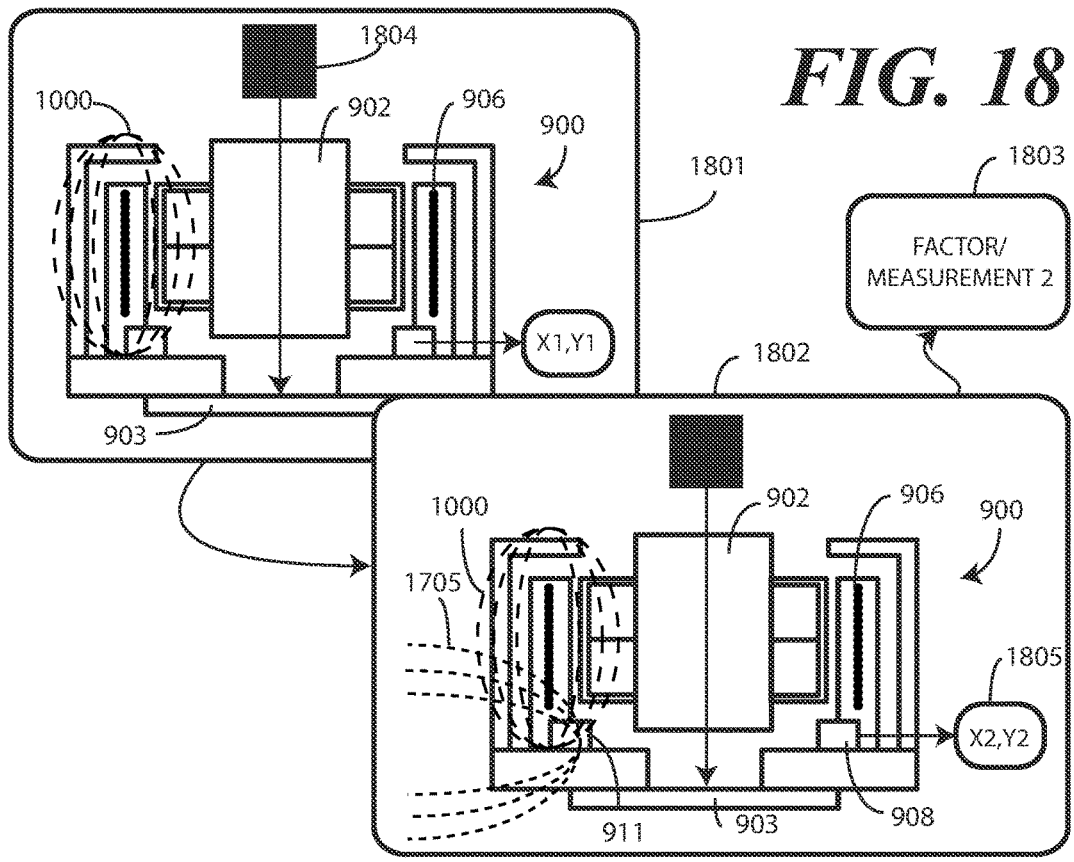
FIG. 18 illustrates one or more method steps for determining another voice coil motor sensor correction factor in accordance with one or more embodiments of the disclosure.

Turning now to FIG. 18, illustrated therein is a pictorial representation of one method of performing the steps of the method (1600) of FIG. 16. Others will be obvious to those of ordinary skill in the art having the benefit of this disclosure.

Beginning at step 1801, the lens 902 of an imager 900 carried by an electronic device is placed in a predetermined position such that light received by the lens is focused upon an optical center of the image sensor. A laser 1804 is then positioned above the lens such that the laser light is received and detected by the image sensor 903 at the optical center. In one or more embodiments, step 1801 occurs while components, systems, objects, devices, and applications of the electronic device into which the imager 900 is integrated do not influence the magnetic fields 1000 generated by the voice coil motor coil 906.

At step 1802, the electronic device supporting the imager 900 is then transitioned to a second operating condition where components, systems, objects, devices, and applications of the electronic device into which the imager 900 is integrated influence the magnetic fields 1000 generated by the voice coil motor coil 906, either by delivering additional magnetic fields 1705 to the voice coil motor sensors 908,911 or by absorbing the magnetic fields 1000 generated by the voice coil motor coil 906. In one or more embodiments, this causes a deviation in the optical center due to the fact that the lens 902 is moved, thereby redirecting the laser light away from the optical center of the image sensor 903. A deviation measurement 1805 can be recorded as a function of the second operating condition occurring. In one or more embodiments, the deviation measurement 1805 of step 1802 are taken when the components, systems, devices, and applications of the electronic device are OFF, but are physically located at a predefined geometric relationship to the voice coil motor sensors 908,911. In other embodiments, the components, systems, devices, and applications of the electronic device are ON. Of course, a combination of these techniques could be used as well.

At step 1803, one or more processors of the electronic device carrying the imager can calculate a voice coil motor correction factor required to eliminate the deviation in the optical center while the second condition is occurring. In one or more embodiments, this second voice coil motor correction factor is calculated using the deviation measurement 1805, since the amount of additional flux in the voice coil motor coil required to correct this deviation can be determined from the physical specifications of the imager once the deviation measurement is known.

In other embodiments, step 1803 optionally comprises applying a modified drive signal to the voice coil motor coil 906 sufficient to cause elimination of the deviation in the optical center, i.e., causing the deviation measurement 1805 to return to zero, and determining a difference between a first voice coil motor sensor measurement when the electronic device is in the first operating condition (step 1801) and a second voice coil motor sensor measurement after application of the modified drive signal to the voice coil motor coil (step 1802). This latter technique reveals a voice coil motor sensor measurement that allowed voice coil motor sensors being interfered by the second operating condition to be used as trusted measurements to ensure the laser light falls on the optical center of the image sensor 903 when the second operating condition is occurring. As with the method steps shown in FIG. 17, the method steps shown in FIG. 18 can be repeated for at least one, and optionally many, additional operating conditions of the electronic device.

Figure 19:
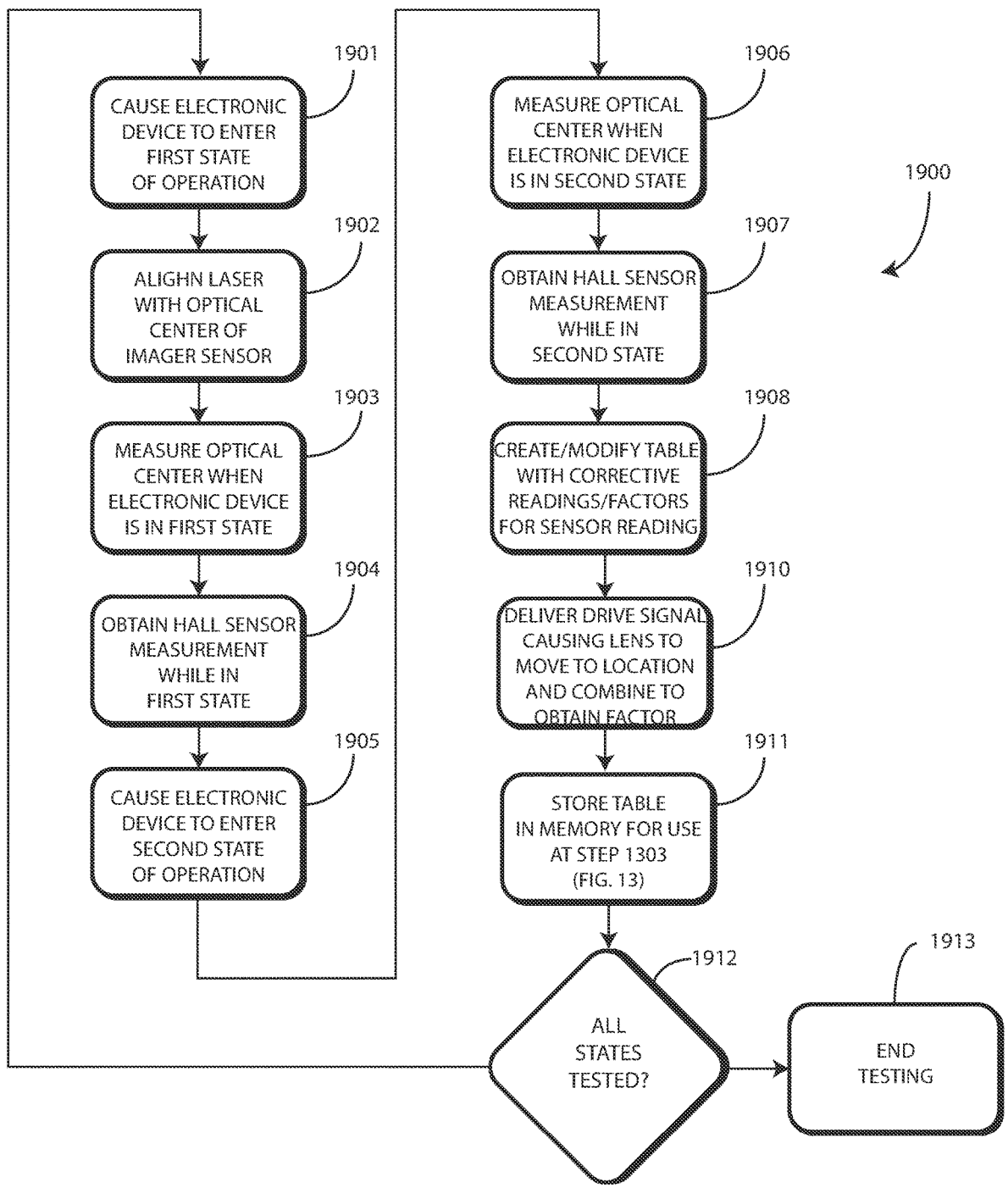
FIG. 19 illustrates another method in accordance with one or more embodiments of the disclosure.

Of course, a combination of the techniques shown in FIGS. 15 and 17, and those shown in FIGS. 16 and 18, can be combined. Said differently, these techniques can combine the voice coil motor correction factor determined by the method of FIGS. 15 and 17 with the other voice coil motor correction factor determined by the method of FIGS. 16 and 18 to create a combined voice coil motor correction factor, which can be stored in a memory for a given operating condition of the electronic device. Said differently, an expected voice coil motor sensor measurement can be created that comprises a combination of a voice coil motor sensor or Hall sensor compensation measurement (FIGS. 15 and 17) and an optical sensor center correction measurement (FIGS. 16 and 18). Turning now to FIG. 19, illustrated therein is one explanatory method 1900 by which this can occur.

Beginning at step 1901, an electronic device having an imager with a voice coil motor is placed in a first operating condition. In one or more embodiments, this first operating condition occurs while the electronic device into which the imager is integrated is in a first operating condition. In one or more embodiments, the first operating condition occurs while components, systems, objects, devices, and applications of the electronic device into which the imager is integrated do not influence the magnetic fields generated by the voice coil motor coil.

At step 1902, a laser is aligned with an optical center of the imager such that light passing through the laser is received at the optical center of the image sensor of the imager. At step 1903, the optical center of an image sensor of an imager is measured with a laser (similar to step 1801 of FIG. 18). At step 1904, voice coil motor sensor measurements (similar to step 1701 of FIG. 17) are recorded while the electronic device is in the first operating condition. Steps 1901-1904 define a "control" test.

At step 1905, the electronic device is transitioned to a second operating condition. In one or more embodiments, the second operating condition occurs while components, systems, objects, devices, and applications of the electronic device into which the imager is integrated do influence the magnetic fields generated by the voice coil motor coil.

At step 1906, the optical center of the image sensor is again measured, but this time while the electronic device is in the second operating condition. At step 1907, voice coil motor sensor measurements are recorded while the electronic device is in the second operating condition. Steps 1905-1907 comprise an "influenced magnetic field" test.

In one or more embodiments, steps 1905-1907 occur when the components, systems, devices, and applications of the electronic device are OFF, but are physically located at a predefined geometric relationship to the voice coil motor sensors. In other embodiments, steps 1905-1907 occur when the components, systems, devices, and applications of the electronic device are ON. Of course, a combination of these techniques could be used as well.

At optional step 1910, the voice coil motor driver can modify the voice coil motor drive signal to drive the lens to a certain position using the laser measurement method (FIG. 18) as a feedback loop. In one or more embodiments, step 1910 comprises reading the voice coil motor sensor, thereby allowing even interfered hall sensor readings to be used as trusted measurements. Thus, in one or more embodiments step 1910 comprises applying a modified drive signal to a voice coil motor coil causing elimination of the deviation in the optical center measured at step 1906.

At step 1911, a voice coil motor correction factor can be calculated using the different measurements obtained at steps 1903 and 1906. Similarly, step 1911 can comprise calculating another voice coil motor correction factor from the difference in measurements obtained at steps 1904 and 1907. In one or more embodiments, step 1911 comprises combining the voice coil motor correction factor and the other voice coil motor sensor correction factor to create a combined voice coil motor correction factor. For example, these values can be averaged to create a combined voice coil motor correction factor. Where optional step 1910 is employed, voice coil motor sensor measurements can be averaged to obtain a single voice coil motor corrective measurement. Step 1911 can further comprise storing the combined voice coil motor correction factor for the second operating condition in the memory of the electronic device.

Decision 1912 determines whether all predetermined operating conditions have been tested, and allows the method 1900 to repeat for any desired operating conditions of the electronic device. Thus, the transitioning of operating condition, the calculation of the voice coil motor correction factor, the combining of the voice coil motor correction factors, and the storage of the voice coil motor correction factor can repeat for at least one additional operating condition of the electronic device. The method 1900 ends at step 1913.

Figure 20:
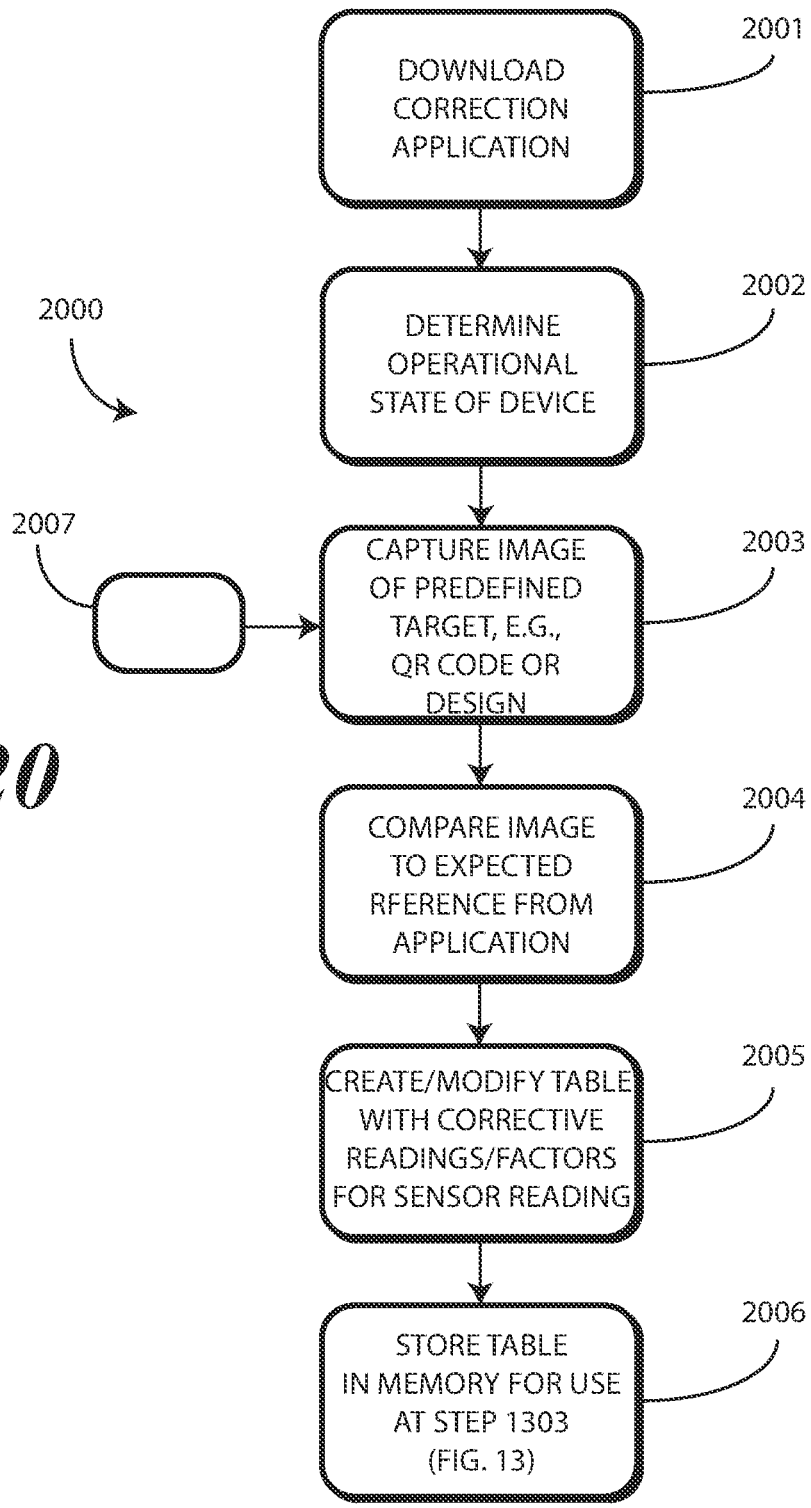
FIG. 20 illustrates yet another method in accordance with one or more embodiments of the disclosure.

It may be surmised that the methods of FIGS. 15-19 are most suitably performed by a manufacturer. The method steps shown in FIG. 18, for example, require the positioning of an external laser to measure deviations in the optical center that arise due to an operating condition of the electronic device influencing one or more magnetic fields being measured by a voice coil motor sensor. However, embodiments of the disclosure are not so limited. Embodiments of the disclosure also contemplate that the generation of a look-up table similar to that shown in FIG. 14, or at least the generation of one or more expected voice coil motor sensor measurements or voice coil motor correction factors can be accomplished by a user without the necessity of laboratory or manufacturing equipment as well. Turning now to FIG. 20, illustrated therein is one such method 2000 by which this can occur.

Beginning at step 2001, in one or more embodiments a user first downloads a correction application. In one or more embodiments, the correction application can comprise code or instructions suitable for use in a magnetic devices compensation engine (145) of an electronic device (100), or by one or more processors (112) of an electronic device (100). In one or more embodiments, the correction application downloaded at step 2001 can be downloaded using a communication circuit (114) of the electronic device (100) from a remote server across a network, such as the Internet.

At step 2002, the one or more processors (112), using one or more sensors (135), can determine a spatial orientation of the electronic device (100) in three-dimensional space (143). Step 2003 can then comprise the user employing an imager (106,121,128,129) of the electronic device (100) to capture an image of a predefined target 2007, such as a predefined pattern, a Quick Response (QR) code, a barcode, or other predefined target 2007 while the electronic device (100) is in a predefined condition. Illustrating by example, in one or more embodiments step 2003 comprises the user an employing an imager (106,121,128,129) of the electronic device (100) to capture an image of a QR code while a first device housing (102) of the electronic device (100) is pivoted about a hinge (101) of the electronic device (100) relative to a second device housing (103) of the electronic device (100) to one of an axially displaced open position (401) or a closed position (201).

Step 2004 can then comprise comparing the image captured at step 2003 to another image captured when the electronic device (100) is operating in a second operating condition. Illustrating by example, in one or more embodiments step 2004 comprises the user transitioning the electronic device (100) to another of the axially displaced open position (401) or the closed position (201), which is different from the operating condition of step 2003, and again employing an imager (106,121,128,129) of the electronic device (100) to capture an image of a QR code while the electronic device is in the second operating condition. Step 2004 can then comprise comparing the image captured at step 2004 to the image captured at step 2003.

At step 2005, the method 2000 calculates, using one or more processors of the electronic device (100), an expected voice coil motor sensor measurement or a voice coil motor correction factor required to eliminate the deviation in the optical center identified by comparing the image captured at step 2003 and the image captured at step 2004 as previously described. Step 2006 can then comprise storing, in a memory of the electronic device, the voice coil motor correction factor or the expected voice coil motor sensor measurement for the second operating condition. The method 2000 of FIG. 20 allows a user to quickly and easily compensate for operating conditions that the user may create, and that may constitute operating conditions that are unique to the user due to their choice of device configuration, physical configuration, usage techniques, and so forth. These operating conditions may not be envisionable by the manufacturer.

Figure 21:
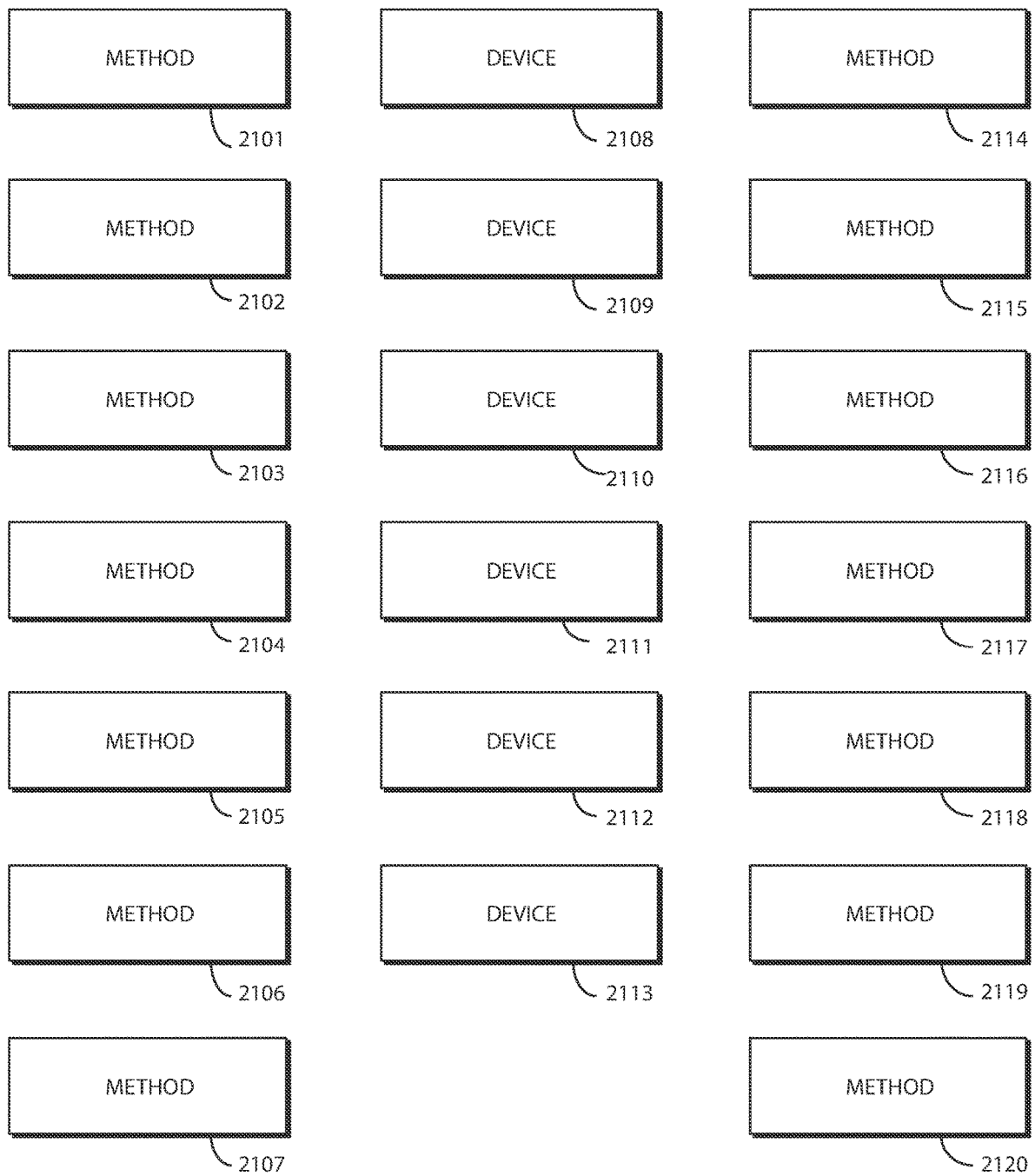
FIG. 21 illustrates various embodiments of the disclosure.

Turning now to FIG. 21, illustrated therein are various embodiments of the disclosure. The embodiments of FIG. 21 are shown as labeled boxes in FIG. 21 due to the fact that the individual components of these embodiments have been illustrated in detail in FIGS. 1-20, which precede FIG. 21. Accordingly, since these items have previously been illustrated and described, their repeated illustration is no longer essential for a proper understanding of these embodiments. Thus, the embodiments are shown as labeled boxes.

At 2101, a method in an electronic device comprises determining, with one or more processors, an operating condition of the electronic device influencing one or more magnetic fields measured by a voice coil motor sensor of the electronic device. At 2101, the method comprises obtaining, by the one or more processors from a memory of the electronic device, an expected voice coil motor sensor measurement that is a function of the operating condition.

At 2101, the method comprises causing, by the one or more processors, a voice coil motor driver to modify a voice coil motor drive signal until the voice coil motor sensor detects the expected voice coil motor sensor measurement. At 2102, the one or more processors of 2101 cause the voice coil motor driver to modify the voice coil motor drive signal until the operating condition ceases.

At 2103, the method of 2102 further comprises, after the operating condition ceases, determining, with the one or more processors, another operating condition of the electronic device influencing the one or more magnetic fields measured by the voice coil motor sensor of the electronic device. At 2103, the method further comprises obtaining, by the one or more processors from the memory of the electronic device, another expected voice coil motor sensor measurement that is another function of the other operating condition. At 2103, the method further comprises causing, by the one or more processors, the voice coil motor driver to modify the voice coil motor drive signal until the voice coil motor sensor detects the another expected voice coil motor sensor measurement.

At 2104, the method of 2101 further comprises delivering, by the voice coil motor driver, the voice coil motor drive signal to a voice coil of an imager of the electronic device, thereby positioning a lens of the imager in three-dimensional space relative to an image sensor of the imager. At 2105, the voice coil motor of 2104 modifies the voice coil motor drive signal by increasing the voice coil motor drive signal.

At 2106, the operating condition of 2104 comprises a first device housing of the electronic device being pivoted about a hinge of the electronic device relative to a second device housing of the electronic device from a closed position, where the first device housing is retained to the second device housing by one or more magnets, to an axially displaced open position. At 2107, the expected voice coil motor sensor measurement of 2104 comprises a combination of a Hall effect sensor compensation measurement and an optical sensor center correction measurement.

At 2108, an electronic device comprises a device housing. At 2108, the electronic device comprises an imager supported by the device housing.

At 2108, the imager comprises a lens and an image sensor, with a voice coil motor positioning the lens in three-dimensional space relative to the image sensor. At 2108, the imager comprises a voice coil motor driver delivering a voice coil motor drive signal to the voice coil motor and a voice coil motor sensor operable to detect a drive state of the voice coil motor responsive to the voice coil motor drive signal. At 2108, the electronic device comprises one or more processors operable with the voice coil motor driver and a memory operable with the one or more processors.

At 2108, the one or more processors determine an operating condition of the electronic device influencing one or more magnetic field measured by the voice coil motor sensor. At 2108, the one or more processors retrieve an expected voice coil motor sensor measurement from the memory that is a function of the operating condition of the electronic device. At 2108, the one or more processors cause the voice coil motor driver to modify the voice coil motor drive signal until the voice coil motor sensor obtains the expected voice coil motor sensor measurement.

At 2109, the device housing of 2108 comprises a first device housing pivotable about a hinge relative to a second device housing between an axially displaced open position and a closed position. At 2110, the operating condition of 2109 comprises the first device housing being pivoted about the hinge relative to the second device housing to the axially displaced open position.

At 2111, the voice coil motor driver of 2108 modifies the voice coil motor drive signal until the operating condition ceases. At 2112, the voice coil motor sensor of 2108 comprises a Hall effect sensor, with the expected voice coil motor sensor measurement compensating for a magnetic noise offset measured by the Hall effect sensor due to the operating condition of the electronic device occurring. At 2113, the one or more processors of 2112 cause the voice coil motor driver to increase the voice coil motor drive signal until the voice coil motor sensor obtains the expected voice coil motor sensor measurement.

At 2114, a method in an electronic device comprises determining, with an image sensor, an optical center when the electronic device is in a first operating condition. At 2114, the method comprises transitioning, with one or more processors of the electronic device, the electronic device to a second operating condition influencing one or more magnetic fields measured by a voice coil motor sensor of the electronic device and causing a deviation in the optical center.

At 2114, the method comprises calculating, with the one or more processors, a voice coil motor correction factor required to eliminate the deviation in the optical center while the second operating condition is occurring. At 2114, the method comprises storing, in a memory of the electronic device, the voice coil motor correction factor for the second operating condition.

At 2115, the method of 2114 further comprises obtaining, with the voice coil motor sensor, a first voice coil motor sensor measurement when the electronic device is in a first operating condition. At 2115, the method comprises obtaining, with the voice coil motor sensor, a second voice coil motor sensor measurement when the electronic device is in a second operating condition. At 2115, the method comprises calculating, with one or more processors operable with the voice coil motor sensor, another voice coil motor sensor correction factor as a function of the first operating condition and the second operating condition.

At 2116, the method of 2115 further comprises combining the voice coil motor correction factor and the other voice coil motor sensor correction factor to create a combined voice coil motor correction factor. At 2116, the method comprises storing the combined voice coil motor correction factor for the second operating condition in the memory of the electronic device.

At 2117, the method of 2114 further comprises repeating the transitioning, the calculating, and the storing for at least one additional operating condition of the electronic device. At 2118, the calculating the voice coil motor correction factor required to eliminate the deviation in the optical center while the second operating condition is occurring at 2114 comprises applying a modified drive signal to a voice coil motor coil causing elimination of the deviation in the in the optical center and determining a difference between a first voice coil motor sensor measurement when the electronic device is in the first operating condition and a second voice coil motor sensor measurement after application of the modified drive signal to the voice coil motor coil.

At 2119, the second operating condition of 2114 comprises a first device housing of the electronic device being pivoted about a hinge of the electronic device relative to a second device housing to a closed position with one or more magnets retaining the first device housing against the second device housing. At 2120, the determining of 2114 comprises capturing an image of a predefined target while the electronic device is in one of an axially displaced open position or a closed position, and the transitioning comprising pivoting a first device housing about a hinge relative to a second device housing from the axially displaced open position to a closed position.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
a device housing;
an imager supported by the device housing, the imager comprising a lens and an image sensor, with a voice coil motor positioning the lens in three-dimensional space relative to the image sensor, a voice coil motor driver delivering a voice coil motor drive signal to the voice coil motor, and a voice coil motor sensor operable to detect a drive state of the voice coil motor responsive to the voice coil motor drive signal;
one or more processors operable with the voice coil motor driver; and
a memory operable with the one or more processors;
the one or more processors determining an operating condition of the electronic device influencing one or more magnetic field measured by the voice coil motor sensor, retrieving an expected voice coil motor sensor measurement from the memory that includes a correction factor that is a function of the operating condition of the electronic device, and causing the voice coil motor driver to modify the voice coil motor drive signal until the voice coil motor sensor obtains the expected voice coil motor sensor measurement;
wherein the correction factor is calculated from a combination of a difference in optical center measurements and a difference in voice coil sensor measurements corresponding to two different operating states of the electronic device.

2. The electronic device of claim 1, wherein the device housing comprises a first device housing pivotable about a hinge relative to a second device housing between an axially displaced open position and a closed position.

3. The electronic device of claim 2, wherein the operating condition comprises the first device housing being pivoted about the hinge relative to the second device housing to the axially displaced open position.

4. The electronic device of claim 1, the voice coil motor driver modifying the voice coil motor drive signal until the operating condition ceases.

5. The electronic device of claim 1, the voice coil motor sensor comprises a Hall effect sensor, with the expected voice coil motor sensor measurement compensating for a magnetic noise offset measured by the Hall effect sensor due to the operating condition of the electronic device occurring.

6. The electronic device of claim 5, the one or more processors causing the voice coil motor driver to increase modify the voice coil motor drive signal until the voice coil motor sensor obtains the expected voice coil motor sensor measurement.

7. A method in an electronic device, the method comprising:
determining, with an image sensor, an optical center when the electronic device is in a first operating condition;
transitioning, with one or more processors of the electronic device, the electronic device to a second operating condition influencing one or more magnetic fields measured by a voice coil motor sensor of the electronic device and causing a deviation in the optical center;
calculating, with the one or more processors, a voice coil motor correction factor required to eliminate the deviation in the optical center while the second operating condition is occurring; and
storing, in a memory of the electronic device, the voice coil motor correction factor for the second operating conditions;
wherein the calculating the voice coil motor correction factor required to eliminate the deviation in the optical center while the second operating condition is occurring comprises applying a modified drive signal to a voice coil motor coil causing elimination of the deviation in the optical center and determining a difference between a first voice coil motor sensor measurement when the electronic device is in the first operating condition and a second voice coil motor sensor measurement after application of the modified drive signal to the voice coil motor coil.

8. The method of claim 7, further comprising:
obtaining, with the voice coil motor sensor, the first voice coil motor sensor measurement when the electronic device is in the first operating condition;
obtaining, with the voice coil motor sensor, the second voice coil motor sensor measurement when the electronic device is in the second operating condition; and
calculating, with one or more processors operable with the voice coil motor sensor, another voice coil motor sensor correction factor as a function of the first operating condition and the second operating condition.

9. The method of claim 8, further comprising:
combining the voice coil motor correction factor and the another voice coil motor sensor correction factor to create a combined voice coil motor correction factor; and
storing the combined voice coil motor correction factor for the second operating condition in the memory of the electronic device.

10. The method of claim 7, further comprising repeating the transitioning, the calculating, and the storing for at least one additional operating condition of the electronic device.

11. The method of claim 7, wherein the first operating condition occurs when a first device housing of the electronic device is pivoted about a hinge relative to a second device housing to an axially displaced open position.

12. The method of claim 7, the second operating condition comprising a first device housing of the electronic device being pivoted about a hinge of the electronic device relative to a second device housing to a closed position with one or more magnets retaining the first device housing against the second device housing.

13. The method of claim 7, the determining comprising capturing an image of a predefined target while the electronic device is in one of an axially displaced open position or a closed position, and the transitioning comprising pivoting a first device housing about a hinge relative to a second device housing from the axially displaced open position to a closed position.

14. A method in an electronic device, the method comprising:
- determining, with an image sensor, an optical center when the electronic device is in a first operating condition;
- transitioning, with one or more processors of the electronic device, the electronic device to a second operating condition influencing one or more magnetic fields measured by a voice coil motor sensor of the electronic device and causing a deviation in the optical center;
- calculating, with the one or more processors, a voice coil motor correction factor required to eliminate the deviation in the optical center while the second operating condition is occurring;
- calculating, with one or more processors operable with the voice coil motor sensor, another voice coil motor sensor correction factor as a function of voice coil motor sensor measurements obtained at the first operating condition and the second operating condition;
- combining the voice coil motor correction factor and the another voice coil motor sensor correction factor to create a combined voice coil motor correction factor; and
- storing, in a memory of the electronic device, the combined voice coil motor correction factor for the second operating condition.

15. The method of claim 14, further comprising:
- obtaining, with the voice coil motor sensor, a first voice coil motor sensor measurement when the electronic device is in the first operating condition; and
- obtaining, with the voice coil motor sensor, a second voice coil motor sensor measurement when the electronic device is in the second operating condition.

16. The method of claim 14, the second operating condition comprising a first device housing of the electronic device being pivoted about a hinge of the electronic device relative to a second device housing to a closed position with one or more magnets retaining the first device housing against the second device housing.

17. The method of claim 14, wherein the first operating condition results from a first physical manipulation of the electronic device and the second operating condition results from a second physical manipulation of the electronic device that is different from the first physical manipulation.

18. The method of claim 14, wherein a display of the electronic device is actively operational in the first operating condition.

19. The method of claim 14, wherein the first operating condition results from the electronic device being adjacent to a ferrous metal surface.

20. The method of claim 14, wherein the combined voice coil motorcorrection factor is expressed in micro-Tesla.

* * * * *